United States Patent
Kim

(10) Patent No.: US 7,446,371 B2
(45) Date of Patent: Nov. 4, 2008

(54) NON-VOLATILE MEMORY CELL STRUCTURE WITH CHARGE TRAPPING LAYERS AND METHOD OF FABRICATING THE SAME

(75) Inventor: Sang-su Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 11/167,051

(22) Filed: Jun. 24, 2005

(65) Prior Publication Data

US 2006/0086970 A1    Apr. 27, 2006

Related U.S. Application Data

(60) Provisional application No. 60/620,811, filed on Oct. 21, 2004.

(30) Foreign Application Priority Data

Jan. 6, 2005    (KR)    .................. 10-2005-0001267

(51) Int. Cl.
 *H01L 29/72* (2006.01)
(52) U.S. Cl. .................. 257/321; 257/317; 257/322; 257/401
(58) Field of Classification Search .................. 257/321, 257/317, 322, 401
See application file for complete search history.

(56) References Cited

U.S. PATENT DOCUMENTS

| | | | | |
|---|---|---|---|---|
| 5,969,384 A | * | 10/1999 | Hong | .................. 257/322 |
| 6,335,554 B1 | | 1/2002 | Yoshikawa | .................. 257/316 |
| 6,756,271 B1 | | 6/2004 | Satoh et al. | |
| 6,791,140 B2 | | 9/2004 | Prall | .................. 257/315 |
| 6,794,711 B2 | | 9/2004 | Kang et al. | .................. 257/315 |
| 7,049,651 B2 | * | 5/2006 | Mikolajick et al. | .......... 257/315 |
| 2003/0198086 A1 | | 10/2003 | Shukuri | |
| 2004/0021172 A1 | * | 2/2004 | Zheng et al. | ................. 257/316 |
| 2005/0037577 A1 | * | 2/2005 | Kim et al. | .................... 438/260 |
| 2005/0156227 A1 | * | 7/2005 | Jeng | .......................... 257/321 |
| 2006/0076609 A1 | * | 4/2006 | Chindalore et al. | ......... 257/316 |
| 2006/0170032 A1 | * | 8/2006 | Bhattacharyya | ............. 257/317 |

FOREIGN PATENT DOCUMENTS

| | | |
|---|---|---|
| JP | 2000-22008 A | 1/2000 |
| KR | 10-2006-0019299 A | 3/2006 |

OTHER PUBLICATIONS

Lusky, Eli, et al. "Characterization of Channel Hot Electron Injection by the Subthreshold Slope of NROM Device," IEEE Electron Device Letters, vol. 22, No. 11, Nov. 2001.

* cited by examiner

*Primary Examiner*—Edward Wojciechowicz
(74) *Attorney, Agent, or Firm*—Mills & Onello LLP

(57) ABSTRACT

In a non-volatile memory device and a method for forming such a device, at least one edge of the charge trapping layer is recessed. In this manner, the threshold voltage of the device during a programming operation and the threshold voltage of the device during an erase operation are maintained at an appropriate and consistent level. As a result, device characteristics are improved.

28 Claims, 20 Drawing Sheets

NON-VOLATILE MEMORY CELL STRUCTURE WITH CHARGE TRAPPING LAYERS AND METHOD OF FABRICATING THE SAME

RELATED APPLICATIONS

This application claims the benefit of U.S. Provisional Application Ser. No. 60/620,811, filed Oct. 21, 2004, and further claims priority under 35 U.S.C. 119 to Korean Patent Application No. 10-2005-0001267, filed on Jan. 6, 2005, the disclosures of which are hereby incorporated herein by reference in their entirety.

BACKGROUND OF THE INVENTION

Non-volatile memory devices are popular in contemporary electronic systems, especially portable electronic systems that rely on battery sources for power. Such non-volatile memory devices retain information even when the system power source is inactivated, and therefore do not require a power-consuming refresh operation for maintaining stored data.

With reference to FIG. 1, in a conventional non-volatile memory cell structure of the SONOS type, a charge trapping structure 110 is formed on a silicon substrate 102 where a drain region 104 and a source region 106 are separated from each other by a predetermined distance. The charge trapping structure 110 has a stacked structure, in which a tunneling layer 112 formed of a first silicon oxide layer, a charge trapping layer 114 formed of a silicon nitride layer, and a blocking layer 116 formed of a second silicon oxide layer are sequentially stacked on a surface of the silicon substrate 102. A control gate electrode 120, which is formed of a polysilicon layer, is formed on the charge trapping structure 110.

To perform a programming or writing operation, a positive bias voltage is applied to the gate electrode 120 and the source region 106, and the drain region 104 is grounded. The voltage that is applied to the gate electrode 120 and the source region 106 induces a vertical electric field and a horizontal electric field along the channel region in a direction from the drain region 104 to the source region 106. Due to the electric fields, electrons are pushed away from the drain region 104 and accelerate toward the source region 106. The electrons gain energy when moving along the channel region, and some electrons enter into a hot state whereby they can gain enough energy to enter the charge trapping layer 114, leaping over the potential barrier of the tunneling layer 112. This happens most frequently near the drain region 106, because the electrons can gain the greatest amount of energy in that region. Once the electrons in the hot state enter the charge trapping layer 114, the electrons in the hot state are trapped in the charge trapping layer 114 and become stored therein, and thus the threshold voltage of the memory cell increases.

To perform an erasing operation, a different voltage than the voltage used in programming or reading the memory cell is required. For example, a positive bias voltage is applied to the source region 106, and a negative bias voltage is applied to the gate electrode 120. The drain region 104 is floated. In this state, the electrons, which are stored in the charge trapping layer 114, move toward the source region 106, and holes within the source region 106 migrate to the charge trapping layer 114. The electrons stored in the charge trapping layer 114 are removed or neutralized by the holes, and thus data on the memory cell is erased.

In a conventional SONOS memory device, a certain amount of electrons that were previously trapped in the overlapping region of a gate electrode and a source region or that of a gate electrode and a drain region may still remain in the charge trapping layer following completion of the erasing operation.

The potential barrier between a channel region and a source/drain region may increase due to the remaining electrons following the erasing operation. As the potential barrier increases, the sub-threshold voltage slope of the non-volatile memory device declines. This phenomenon is described in the article "Characterization of Channel Hot Electron Injection by the Subthreshold Slope of NROM™ Device" by Eli Lusky et al., IEEE Electron Device Letters, Vol. 22, No. 11, November 2001.

Device characteristics are degraded when this occurs because the difference in the threshold voltage between the programmed state and the erased state of the device is decreased.

SUMMARY OF THE INVENTION

The present invention is directed to a non-volatile memory device and a method for forming such a device in which at least one edge of the charge trapping layer is recessed. In this manner, the threshold voltage of the device during a programming operation and the threshold voltage of the device during an erase operation are maintained at an appropriate level. As a result, device characteristics are improved.

In one aspect, the present invention is directed to a non-volatile memory device. The device comprises: a semiconductor substrate; a source region and a drain region in an upper portion of the substrate at spaced-apart positions; a charge-trapping structure on the substrate between the source region and the drain region; and a gate electrode on the charge trapping structure, wherein a recess is present in the charge-trapping structure between the gate electrode and a portion of at least one of the source region and the drain region.

In one embodiment, the gate electrode overlaps a portion of the source region and a portion of the drain region.

In another embodiment, the source region and drain region each include a highly doped region and a lightly doped region, the lightly doped regions of the source region and the drain region extending toward each other from the corresponding highly doped regions along an upper portion of the substrate, and the gate electrode overlaps a portion of the lightly doped regions of the source region and the drain region. In another embodiment, the lightly doped source and drain regions, when originally formed, are self-aligned with the source side and the drain side of the gate electrode. In another embodiment, the lightly doped source and drain regions are extended under the source side and the drain side respectively of the gate electrode by a diffusion process. In another embodiment, sidewall spacers are provided at source and drain sides of the gate electrode wherein the highly doped source and drain regions, when originally formed, are self-aligned with outer sides of the sidewall spacers.

In another embodiment, the source and drain regions, when originally formed, are self-aligned with a source side and a drain side respectively of the gate electrode. In another embodiment, the source and drain regions are extended under the source side and the drain side respectively of the gate electrode by a diffusion process. In another embodiment, an inner edge of at least one of the source and drain regions is substantially aligned with an outer edge of the charge trapping structure.

In another embodiment, the recess is at a source region side of the charge trapping structure. In another embodiment, the recess is at both a source region side and a drain region side of the charge trapping structure.

In another embodiment, a dielectric material is provided in the recess.

In another embodiment, the charge trapping structure comprises a first dielectric, a second dielectric on the first dielectric, and a third dielectric on the second dielectric. In another embodiment, the first dielectric comprises a material selected from the group consisting of silicon oxide and silicon oxynitride; wherein the second dielectric comprises a material selected from the group consisting of silicon nitride, silicon oxynitride, and a high-k dielectric, and wherein the third dielectric comprises silicon oxide. In another embodiment, the recess is formed in the second dielectric.

In another embodiment, the charge trapping structure comprises a quantum dot structure including a first dielectric, a quantum dot array on the first dielectric and a second dielectric on the quantum dot array. In another embodiment, the first dielectric comprises a material selected from the group consisting of silicon oxide and silicon oxynitride; wherein the quantum dot array comprises quantum dots of a type selected from the group consisting of polysilicon quantum dots, and silicon nitride quantum dots, and wherein the second dielectric comprises silicon oxide.

In another embodiment, the charge trapping structure extends from the source region to an intermediate region between the source region and the drain region, and further comprising a gate dielectric on the substrate extending from the charge trapping structure in the intermediate region to the drain region, and wherein the gate electrode is on the charge trapping structure and on the gate dielectric.

In another embodiment, the charge trapping structure comprises a first charge trapping structure and wherein the gate electrode comprises a first auxiliary gate electrode, and further comprising: a primary gate dielectric on the substrate between the source region and the drain region; a primary gate electrode on the primary gate dielectric; the first charge-trapping structure being on the substrate between the source region and the primary gate electrode; the first auxiliary gate electrode being on the first charge trapping structure, wherein a first recess is present in the first charge trapping structure between the first auxiliary gate electrode and a portion of the source region; a second charge-trapping structure on the substrate between the drain region and the primary gate electrode; and a second auxiliary gate electrode on the second charge trapping structure, wherein a second recess is present in the second charge trapping structure between the second auxiliary gate electrode and a portion of the drain region.

In another aspect, the present invention is directed to a non-volatile memory device comprising: a semiconductor substrate; a source region and a drain region in an upper portion of the substrate at spaced-apart positions; a primary gate dielectric on the substrate between the source region and the drain region; a primary gate electrode on the primary gate dielectric; a first charge-trapping structure on the substrate between the source region and the primary gate electrode; and a first auxiliary gate electrode on the first charge trapping structure, wherein a first recess is present in the first charge trapping structure between the first auxiliary gate electrode and a portion of the source region; a second charge-trapping structure on the substrate between the drain region and the primary gate electrode; and a second auxiliary gate electrode on the second charge trapping structure, wherein a second recess is present in the second charge trapping structure between the second auxiliary gate electrode and a portion of the drain region.

In one embodiment, the first and second auxiliary gate electrodes comprise conductive lateral spacers formed on the first charge trapping structure and the second charge trapping structure at a drain side and a source side respectively of the primary gate electrode. In another embodiment, the source and drain regions, when originally formed, are self-aligned with outer edges of the first and second auxiliary gate electrodes. In another embodiment, the first and second charge trapping structures each comprise a first dielectric, a second dielectric on the first dielectric, and a third dielectric on the second dielectric. In another embodiment, the first dielectric comprises a material selected from the group consisting of silicon oxide and silicon oxynitride; wherein the second dielectric comprises a material selected from the group consisting of silicon nitride, silicon oxynitride, and a high-k dielectric, and wherein the third dielectric comprises silicon oxide. In another embodiment, the first and second recesses are formed in the second dielectric of the first and second charge trapping structures, respectively.

In another embodiment, the first and second charge trapping structures each comprise a quantum dot structure including a first dielectric, a quantum dot array on the first dielectric and a second dielectric on the quantum dot array. In another embodiment, the first dielectric comprises a material selected from the group consisting of silicon oxide and silicon oxynitride; wherein the quantum dot array comprises quantum dots of a type selected from the group consisting of polysilicon quantum dots, and silicon nitride quantum dots, and wherein the second dielectric comprises silicon oxide.

In another embodiment, the source region and drain region each include a highly doped region and a lightly doped region; the lightly doped regions of the source region and the drain region extending toward each other from the corresponding highly doped regions along an upper portion of the substrate, and each of the first and second auxiliary gate electrodes respectively overlap a portion of the lightly doped regions of the source region and the drain region. In another embodiment, the lightly doped source and drain regions, when originally formed, are self-aligned with a source side and a drain side of the primary gate electrode. In another embodiment, the lightly doped source and drain regions are extended under the source side and the drain side respectively of the primary gate electrode by a diffusion process.

In another embodiment, a dielectric material is present in the first and second recesses.

In another aspect, the present invention is directed to a method of forming a non-volatile memory device comprising: providing a charge trapping structure on a semiconductor substrate; providing a gate electrode on the charge trapping structure; selectively etching at least one exposed outer edge of the charge trapping structure to form at least one recess between the semiconductor substrate and the gate electrode; and forming a source region and a drain region in the semiconductor substrate using the gate electrode as an ion implantation mask.

In one embodiment, providing a charge trapping structure and providing a gate electrode comprises: providing a charge trapping layer on the semiconductor substrate; providing a gate electrode layer on the charge trapping layer; and patterning the gate electrode layer and the charge trapping layer to form the gate electrode structure and the charge trapping structure.

In another embodiment, providing a charge trapping structure and providing a gate electrode comprises: providing a charge trapping layer on the semiconductor substrate; patterning the charge trapping layer to form a charge trapping structure extending on the substrate between the source region and an intermediate region between the source region and the drain region; providing a gate dielectric on the substrate extending from the charge trapping layer in the intermediate region to the drain region; providing a gate electrode layer on the charge trapping layer and on the gate dielectric; and patterning the gate electrode layer and the gate dielectric to form the gate electrode and the charge trapping structure.

In another embodiment, forming a source region and a drain region is performed following selectively etching the charge trapping structure. In another embodiment, forming a source region and a drain region is performed prior to selectively etching the charge trapping structure.

In another embodiment, the method further comprises diffusing the source region and the drain region so that the gate structure overlaps the source region and the drain region. In another embodiment, diffusing is performed until an inner edge of the at least one of the source and drain regions is substantially aligned with an outer edge of the charge trapping structure.

In another embodiment, selectively etching forms a recess at a source region side of the charge trapping structure.

In another embodiment, the method further comprises, prior to selectively etching, applying a photoresist pattern on a drain-side portion of the gate that extends across a drain-side sidewall of the gate toward the drain region, to prevent etching of a drain region side of the charge trapping structure.

In another embodiment, selectively etching forms a recess at both a source region side and a drain region side of the charge trapping structure.

In another embodiment, forming the source region and drain region comprises: forming a lightly doped source region and a lightly doped drain region in the semiconductor substrate using the gate electrode as a first ion implantation mask; forming lateral spacers on sidewalls of the gate electrode; and forming a highly doped source region and a highly doped drain region in the semiconductor substrate using the lateral spacers as a second ion implantation mask. In another embodiment, the method further comprises diffusing the lightly doped source region and the lightly doped drain region so that the gate structure overlaps the lightly doped source region and the lightly doped drain region.

In another embodiment, providing the charge trapping structure comprises: providing a first dielectric layer; providing a second dielectric layer on the first dielectric layer; and providing a third dielectric layer on the second dielectric layer. In another embodiment, the first dielectric layer comprises a material selected from the group consisting of silicon oxide and silicon oxynitride; wherein the second dielectric layer comprises a material selected from the group consisting of silicon nitride, silicon oxynitride, and a high-k dielectric, and wherein the third dielectric layer comprises silicon oxide. In another embodiment, selectively etching results in the recess being formed in the second dielectric layer.

In another embodiment, providing the charge trapping structure comprises: providing a first dielectric layer; providing a quantum dot array on the first dielectric layer; and providing a second dielectric layer on the quantum dot array. In another embodiment, the first dielectric layer comprises a material selected from the group consisting of silicon oxide and silicon oxynitride; wherein the quantum dot array comprises quantum dots of a type selected from the group consisting of polysilicon quantum dots, and silicon nitride quantum dots, and wherein the second dielectric layer comprises silicon oxide.

In another embodiment, the method further comprises providing a dielectric material in the recess.

In another aspect, the present invention is directed to a method of forming a non-volatile memory device comprising: providing a primary gate dielectric on a semiconductor substrate; providing a primary gate electrode on the primary gate dielectric; providing a charge trapping structure on the primary gate electrode and on the semiconductor substrate; providing first and second auxiliary gate electrodes at first and second sidewalls of the primary gate electrode on the primary gate dielectric; selectively etching at least one exposed outer edge of the charge trapping structure to form a first recess between the semiconductor substrate and the first auxiliary gate electrode; and providing a source region and a drain region in the semiconductor substrate using the primary gate electrode and first and second auxiliary gate electrodes as an ion implantation mask.

In one embodiment, selectively etching further forms a second recess between the semiconductor substrate and the second auxiliary gate electrode.

In another embodiment, providing the first and second auxiliary gate electrodes comprises: forming first and second lateral spacers of conductive material on the charge trapping structure on sidewalls of the primary gate electrode, the first and second lateral spacers comprising, respectively, the first and second auxiliary gate electrodes; and forming the source region and the drain region in the semiconductor substrate using the primary gate electrode and first and second lateral spacers as an ion implantation mask.

In another embodiment, providing the charge trapping structure comprises: providing a first dielectric layer; providing a second dielectric layer on the first dielectric layer; and providing a third dielectric layer on the second dielectric layer. In another embodiment, the first dielectric layer comprises a material selected from the group consisting of silicon oxide and silicon oxynitride; wherein the second dielectric layer comprises a material selected from the group consisting of silicon nitride, silicon oxynitride, and a high-k dielectric, and wherein the third dielectric layer comprises silicon oxide. In another embodiment, selectively etching results in the recess being formed in the second dielectric layer.

In another embodiment, providing the charge trapping structure comprises: providing a first dielectric layer; providing a quantum dot array on the first dielectric layer; and providing a second dielectric layer on the quantum dot array. In another embodiment, the first dielectric layer comprises a material selected from the group consisting of silicon oxide and silicon oxynitride; wherein the quantum dot array comprises quantum dots of a type selected from the group consisting of polysilicon quantum dots, and silicon nitride quantum dots, and wherein the second dielectric layer comprises silicon oxide.

In another embodiment, the method further comprises providing a dielectric material in the recess.

In another embodiment, providing the source region and drain region comprises: prior to providing the first and second auxiliary gate electrodes, forming a lightly doped source region and a lightly doped drain region in the semiconductor substrate using the primary gate electrode as a first ion implantation mask; following providing the first and second auxiliary gate electrodes, forming a highly doped source region and a highly doped drain region in the semiconductor substrate using the primary gate electrode and the first and second gate electrodes as a second ion implantation mask.

In another embodiment, the method further comprises diffusing the lightly doped source and drain regions and the heavily doped source and drain regions to extend the regions in an inward direction toward each other.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
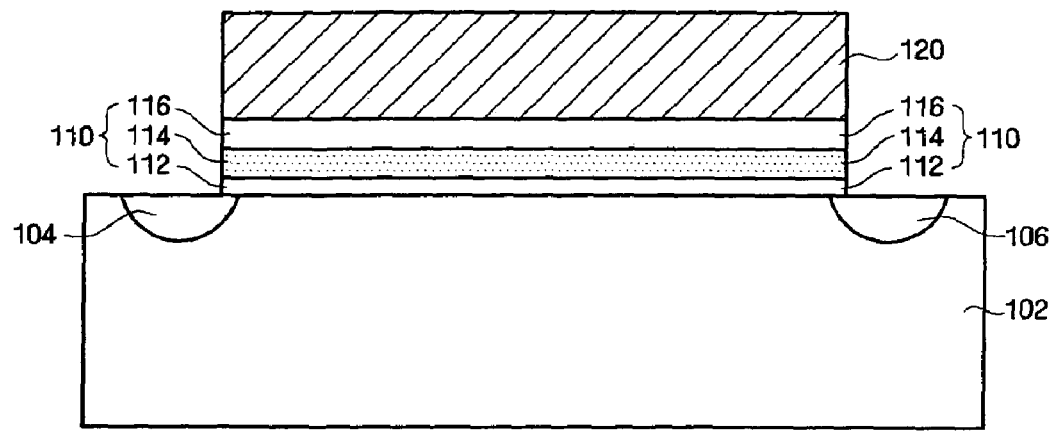
FIG. 1 is cross-sectional illustration of a conventional non-volatile memory device having a SONOS-type charge trapping structure.

The present invention will now be described more fully hereinafter with reference to the accompanying drawings, in which preferred embodiments of the invention are shown. This invention may, however, be embodied in different forms and should not be construed as limited to the embodiments set forth herein. In the drawings, the thicknesses of layers are exaggerated for clarity. In addition, when a layer is described to be formed on another layer or on a substrate, this means that the layer may be formed on the other layer or on the substrate, or a third layer or additional layers may be interposed between the layer and the other layer or the substrate. Like numbers refer to like elements throughout the specification.

Figure 2:
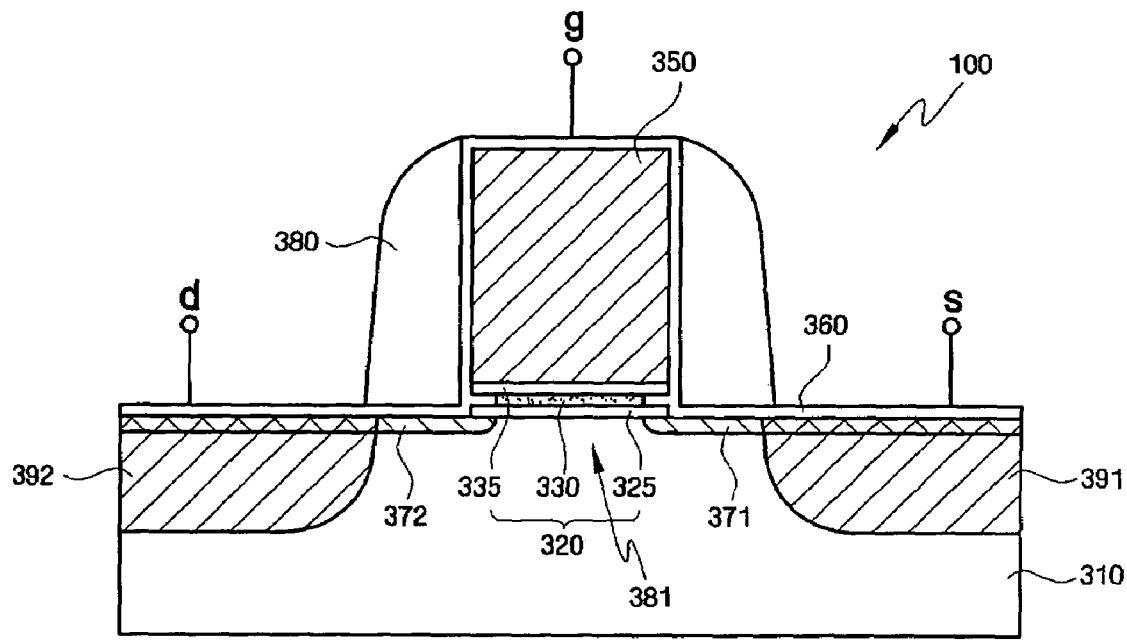
FIG. 2 is a cross-sectional illustration of a non-volatile memory device having a SONOS-type charge trapping structure in which a charge trapping layer is recessed, in accordance with the present invention.

FIG. 2 is a cross-sectional illustration of a non-volatile memory device having a SONOS-type charge trapping structure in which a charge trapping layer is recessed, in accordance with the present invention. The device includes a substrate 310, for example a semiconductor substrate. A source region and a drain region are provided in the substrate on 310 opposite sides of a channel region 381 of the device. The source region comprises a highly doped source region 391 and a lightly doped source region 371. The drain region comprises a highly doped drain region 392 and a lightly doped drain region 372. A charge trapping structure 320 is on the substrate 310 between the source and drain regions of the device. The charge trapping structure 320 includes a tunneling layer 325 formed of a dielectric layer, a charge trapping layer 330 on the tunneling layer 325, and a blocking layer 335 formed of a dielectric layer on the charge trapping layer 330. In one exemplary embodiment, the charge trapping layer 330 comprises an oxide-nitride-oxide (ONO) layer. In another exemplary embodiment, the charge trapping layer 330 comprises a quantum dot structure. A gate electrode 350 is on the charge trapping structure 320, and a gate insulating layer 360 is on the resulting structure. Lateral spacers 380, formed of dielectric material, are provided on source and drain sidewalls of the gate 350.

In the present invention, the charge trapping layer 330 of the charge trapping structure 320 is recessed under the gate 350 on one or both sides. In the example provided in FIG. 2, the charge trapping layer 330 is recessed under both source and drain sides of the gate 350. In an example having a recess on one side of the gate 350, the recess is provided at the source side of the gate 350. Preferably, the recess is deep enough so that the charge trapping layer 330 does not overlap the source/drain regions 371, 372. In the example provided in FIG. 2, the recess is formed on both the source side and the drain side to a depth such that the source-side edge and the drain-side edge of the charge trapping layer 330 are aligned with the inner edges of the lightly doped source region 371 and the lightly doped drain region 372. In one example, the gate length of the gate 350 is 0.2 μm, and there is approximately 10 nm of overlap of the gate 350 over the source region 371. In this example, an appropriate recess depth is on the order of 20-40 nm. Advantages of these configurations will be discussed below.

Figure 3A:
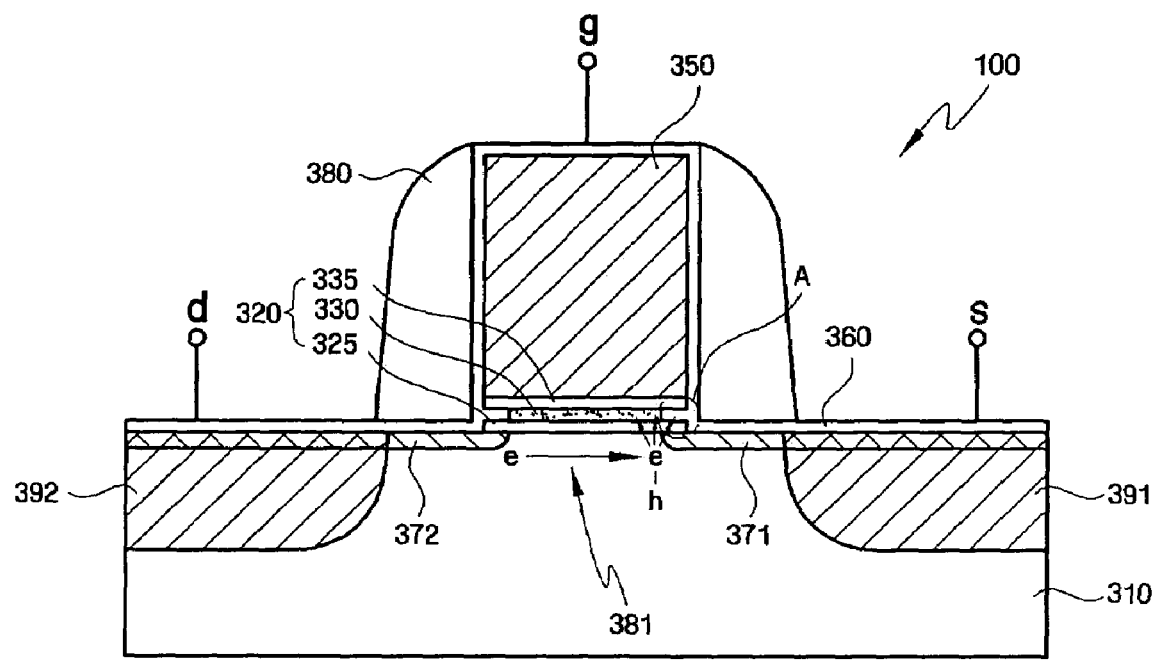
FIG. 3A is a cross-sectional illustration of a non-volatile memory device having a SONOS-type charge trapping structure in which a charge trapping layer is recessed, undergoing a programming operation, in accordance with the present invention.
Figure 3B:
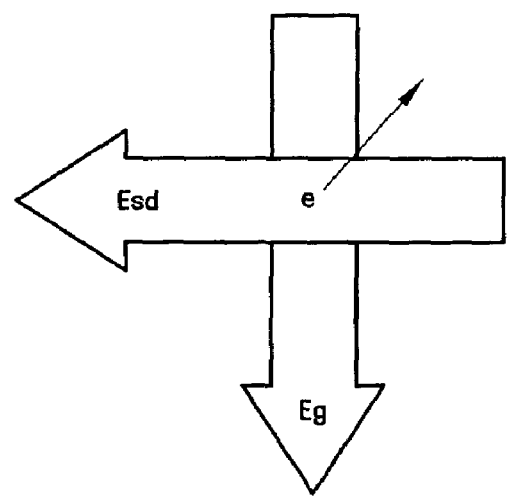
FIG. 3B is an illustration of the orientation of electric fields during the programming operation, for the device of FIG. 3A.

FIG. 3A is a cross-sectional illustration of a non-volatile memory device having a SONOS-type charge trapping structure in which a charge trapping layer is recessed, undergoing a programming operation, in accordance with the present invention. FIG. 3B is an illustration of the orientation of electric fields during the programming operation, for the device of FIG. 3A.

As shown in FIG. 3A, during a programming operation, a positive bias voltage, for example a voltage in the range of approximately 3.0 to 5.0 volts, is applied to the gate-electrode g, a positive bias voltage, for example a voltage in the range of approximately 3.5 to 5.5 volts, is applied to the source electrode s, and a ground voltage is applied to the drain electrode d. During the programming operation, electrons e in a hot state are trapped in the charge trapping layer 330, and become stored therein. In this manner, the threshold voltage of the memory cell 100 is increased. Referring to FIG. 3B, during the programming operation, a gate electric field Eg is oriented in a downward vertical direction, and a source/drain electric field Esd is oriented in a source-to-drain direction. During this operation, electrons in the hot state tend to migrate into the overlapping region A of the device, where the gate 350 overlaps the lightly doped source region 371 at the edge of the charge trapping layer 330 nearest the source region 371, 391. The recess provided in the charge trapping layer 330 minimizes the amount of hot electrons that become trapped in this region A of the charge trapping layer.

Figure 4A:
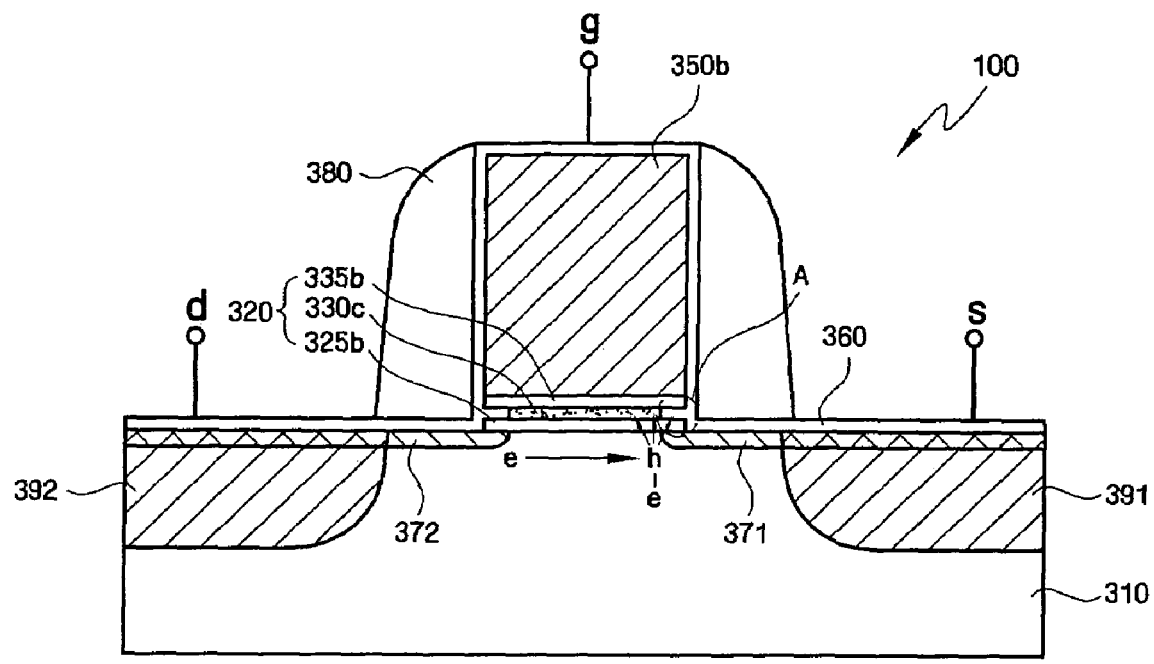
FIG. 4A is a cross-sectional illustration of a non-volatile memory device having a SONOS-type charge trapping structure in which a charge trapping layer is recessed, undergoing a erasing operation, in accordance with the present invention.
Figure 4B:
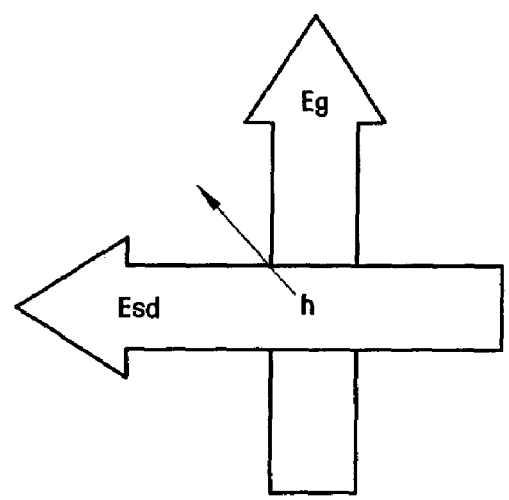
FIG. 4B is an illustration of the orientation of electric fields during the erasing operation, for the device of FIG. 4A.

FIG. 4A is a cross-sectional illustration of a non-volatile memory device having a SONOS-type charge trapping structure in which a charge trapping layer is recessed, undergoing an erasing operation, in accordance with the present invention. FIG. 4B is an illustration of the orientation of electric fields during the erasing operation, for the device of FIG. 4A.

As shown in FIG. 4A, during an erasing operation, a negative bias voltage, for example a voltage in the range of approximately −4.5 to −6.5 volts, is applied to the gate electrode g, a positive bias voltage, for example a voltage in the range of approximately 4.5 to 6.5 volts, is applied to the source electrode s, and a ground voltage is applied to the drain electrode d. During the erasing operation, holes h migrate to the charge trapping layer 330. Therefore, electrons that are stored in the charge trapping layer are removed or neutralized by the holes. In this manner, the memory cell data is erased. Referring to FIG. 4B, during the erasing operation, the gate electric field Eg is oriented in an upward vertical direction, and the source/drain electric field Esd is oriented in a source-to-drain direction. With the presence of the recess at region A, electrons stored in the charge-trapping layer 330 are neutralized during an erase process, and do not remain on the source side of the charge-trapping layer 330 because of the recess.

Figure 5A:
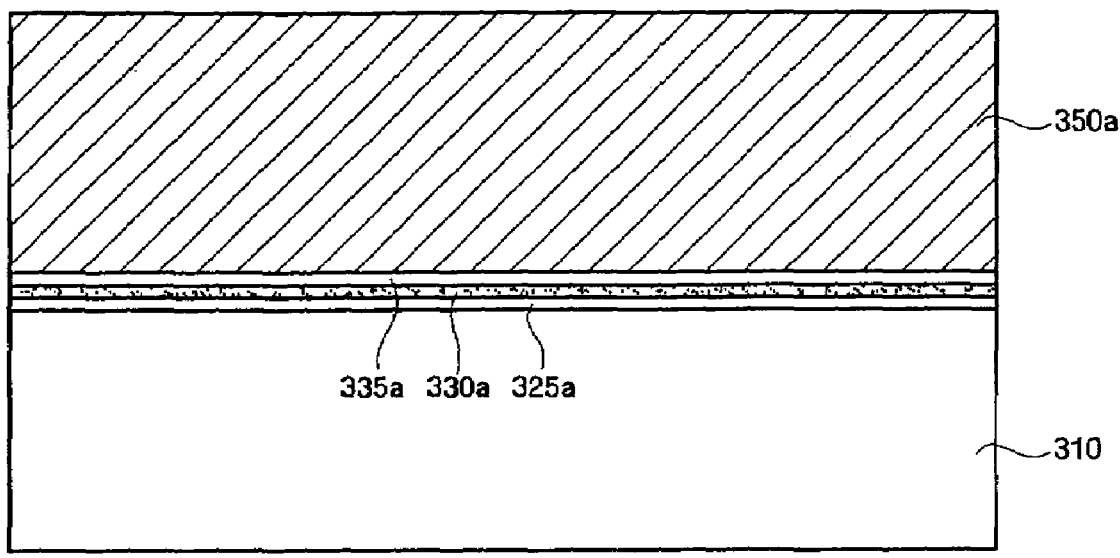
FIGS. 5A-5F are cross-sectional illustrations of a first process for forming a non-volatile memory device having a SONOS-type charge trapping structure in which a charge trapping layer is recessed on both source and drain sides of the gate, in accordance with the present invention.

FIGS. 5A-5F are cross-sectional illustrations of a first process for forming a non-volatile memory device having a SONOS-type charge trapping structure in which a charge trapping layer is recessed on both source and drain sides, in accordance with the present invention. With reference to FIG. 5A, a first dielectric 325a for a tunneling layer, a second dielectric 330a for a charge trapping layer and a third dielectric 335a for a blocking layer are sequentially provided on the substrate 310. In one embodiment, the first dielectric layer 325a comprises a silicon oxide or silicon oxynitride material, for example formed by rapid thermal processing (RTP), chemical vapor deposition (CVD), a furnace process, or other suitable deposition or growth process, at a depth on the order of approximately 30 to 50 Angstroms. The second dielectric layer 330a comprises a silicon nitride, a silicon oxynitride, or high-k dielectric layer, or combination thereof, applied using CVD, low-pressure CVD (LPCVD) or other suitable deposition or growth process, to a depth on the order of approximately 30 to 100 Angstroms. The third dielectric layer 335a comprises a silicon oxide material, for example formed by CVD, LPCVD, or other suitable deposition or growth process, to a depth on the order of approximately 50 to 150 Angstroms. A layer of conductive material 350a suitable for forming a gate electrode is next deposited on the resulting structure. In one embodiment, the conductive material layer 350a comprises a polysilicon material, a metal material, or a combination thereof. A top portion of the conductive material layer 350a may be optionally treated to form a positively doped polysilicon-silicide layer.

The conductive material layer 350a, is applied, for example, using CVD or LPCVD, to a depth on the order of approximately 80 to 2000 Angstroms.

Figure 5B:
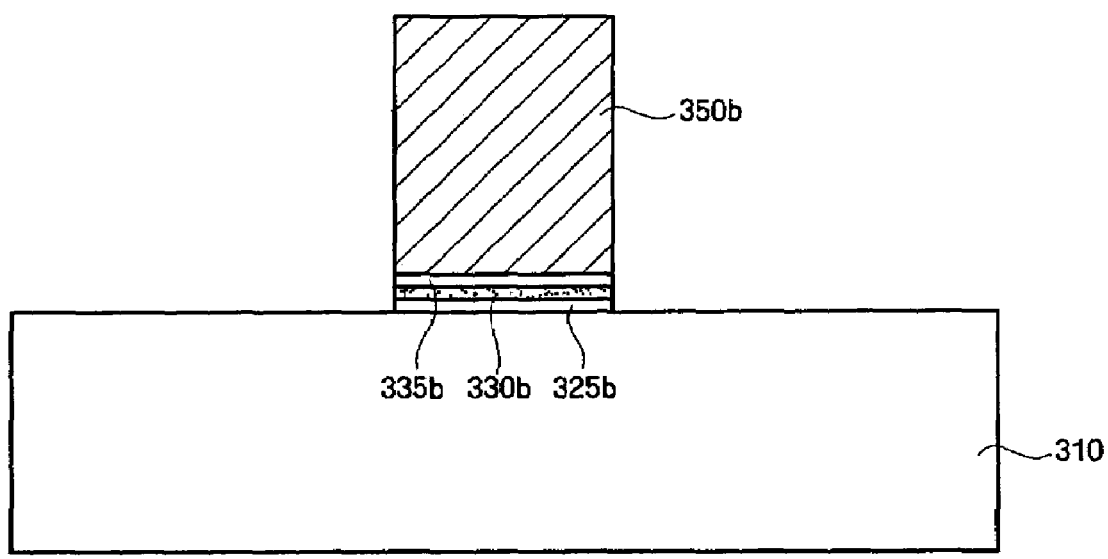

With reference to FIG. 5B, the resulting structure is sequentially patterned using standard photolithographic patterning techniques to form a gate electrode 350b, a blocking layer 335b, a charge trapping layer 330b, and a tunneling layer 325b.

Figure 5C:
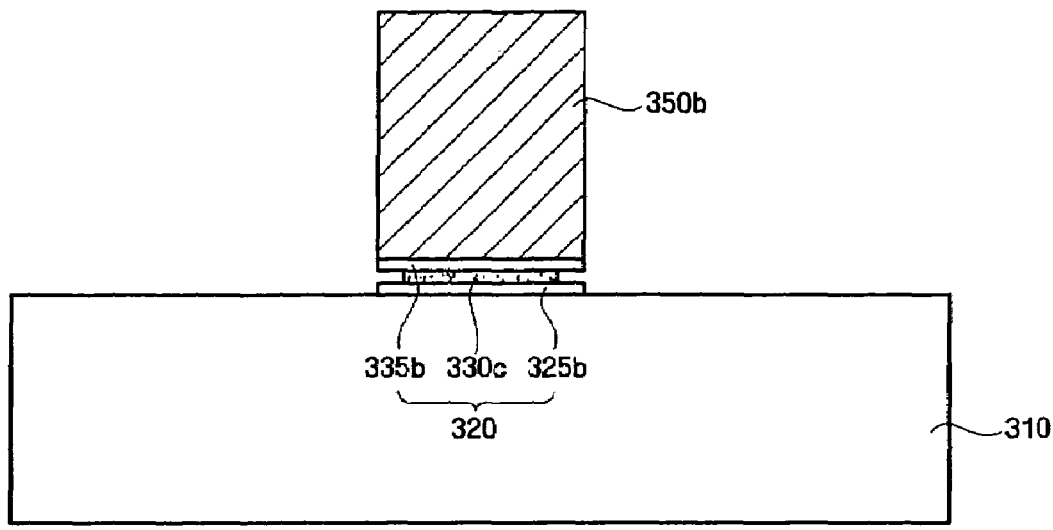

With reference to FIG. 5C, a selective etching process is performed on the resulting structure that results in the selective etching of an outer portion of the charge trapping layer 330b. In one embodiment, in the case where the charge trapping layer 330C comprises silicon nitride or silicon oxynitride, a wet etchant comprising phosphoric oxide ($H_3PO_4$) is suitable for increasing etch selectivity. Following etch of the charge trapping layer 330c, a recess is formed at the edges of the charge trapping layer 330c, and the tunneling layer 325b and blocking layer 335b remain approximately the same width as the gate electrode 350b.

Figure 5D:
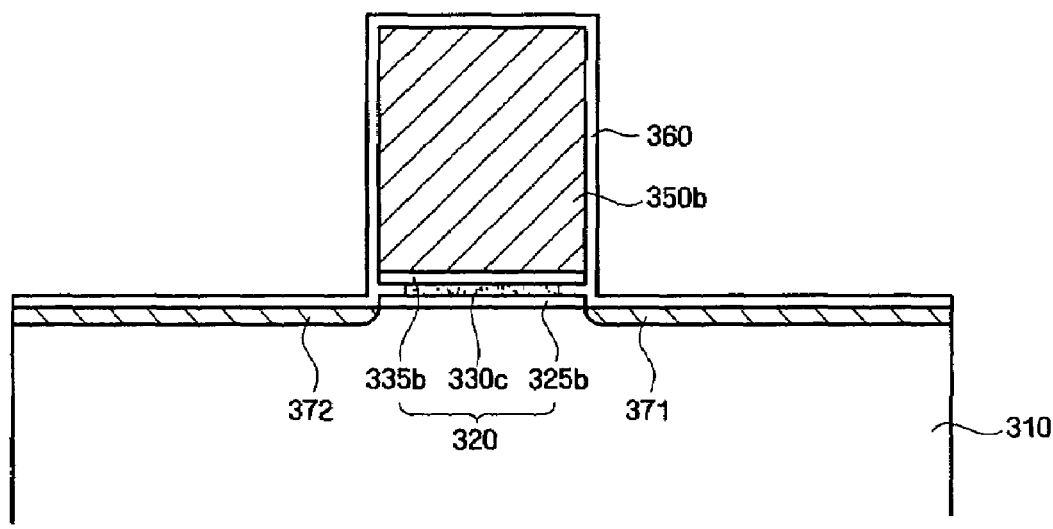

With reference to FIG. 5D, ion implantation is performed on the resulting structure, to form lightly doped source/drain regions 371, 372 of source/drain regions of the device. The resulting lightly doped source/drain regions 371, 372 are self-aligned with the gate electrode 350b. The self-aligned lightly doped source/drain regions can be formed following the selective etching of the charge trapping layer 330c, or optionally, can be formed prior to the selective etching of the charge trapping layer 330c. A gate insulation layer 360 is next formed on the resulting structure. In one embodiment, the gate insulation layer 360 comprises a silicon oxide material, for example formed by CVD, LPCVD, or other suitable deposition or growth process, to a depth on the order of approximately 50 to 100 Angstroms. The recessed region of the charge trapping layer 330c is partially or completely filled by the applied gate insulation layer 360.

Figure 5E:
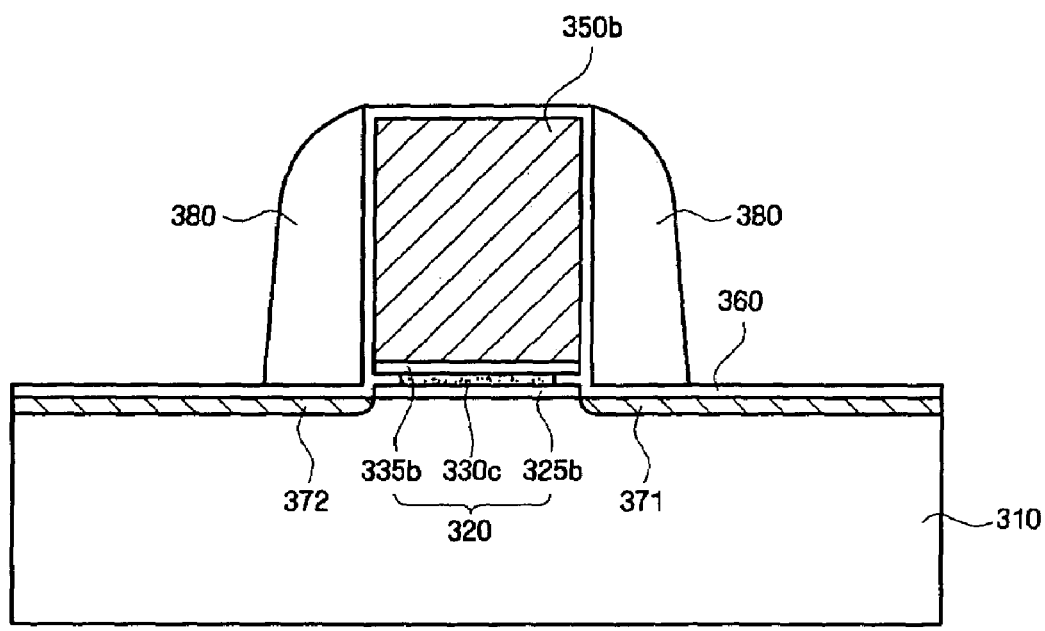

With reference to FIG. 5E, lateral spacers 380 are formed on both source and drain sidewalls of the gate electrode 350b. In one embodiment, a silicon nitride layer is provided on the resulting structure for example formed by CVD, or other suitable deposition or growth process, to a depth on the order of approximately 500 to 700 Angstroms. An etch-back process is then performed according to conventional techniques to form the lateral spacers 380.

Figure 5F:
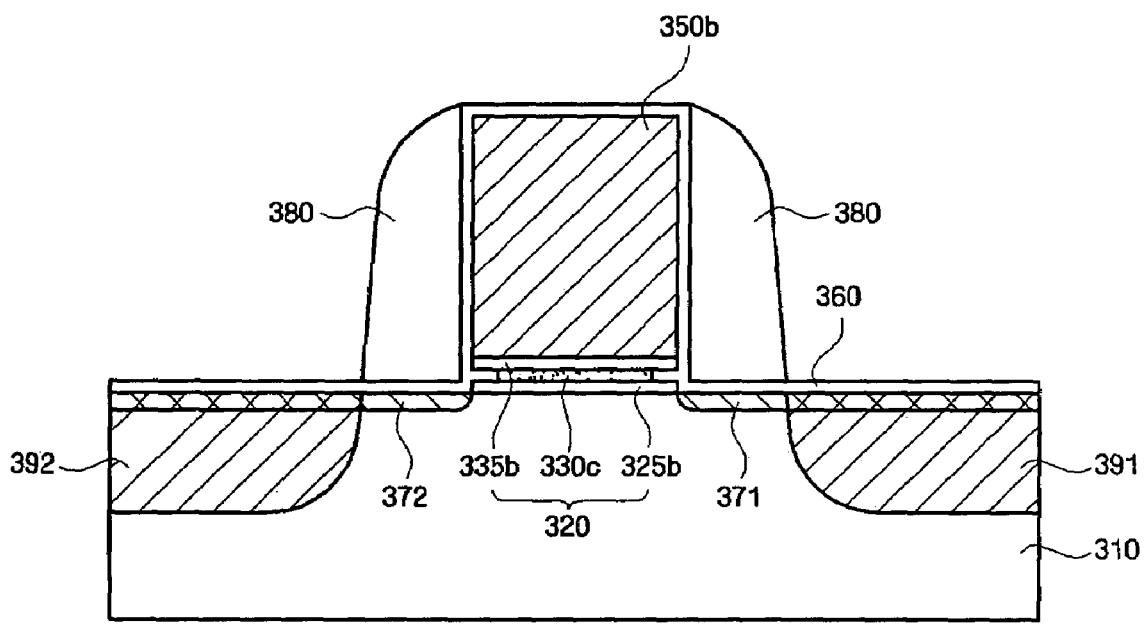

With reference to FIG. 5F, ion implantation is performed on the resulting structure, to form highly doped source/drain regions 391, 392 of the source/drain regions of the device. The resulting highly doped source/drain regions 391, 392 are self-aligned with the lateral spacers 380. A diffusion process is performed on the resulting structure, for example using RTP at a temperature of approximately 1000 C. or greater for a time period of a few seconds, in order to diffuse the lightly doped source/drain regions 371, 372 further inward, into the channel region, so that the gate electrode 350b overlaps the lightly doped source/drain regions 371, 372.

As a result of the first process for fabricating a non-volatile memory device, the device of FIG. 2 above is formed. The resulting device 100 of FIG. 2 has a recessed charge trapping layer. As described above, the recess minimizes the amount of electrons that become trapped in the charge trapping layer above an overlapping region of the gate electrode 350b and the lightly doped source region 371 and therefore may remain following an erase operation. This, in turn, stabilizes the threshold voltage of the transistor for programming and erase procedures, leading to more reliable operation. For example, the recess can prevent misreading of data information stored in the charge trapping layer, despite frequent SONOS memory device access and despite numerous and repetitive programming and erase operations.

Figure 6A:
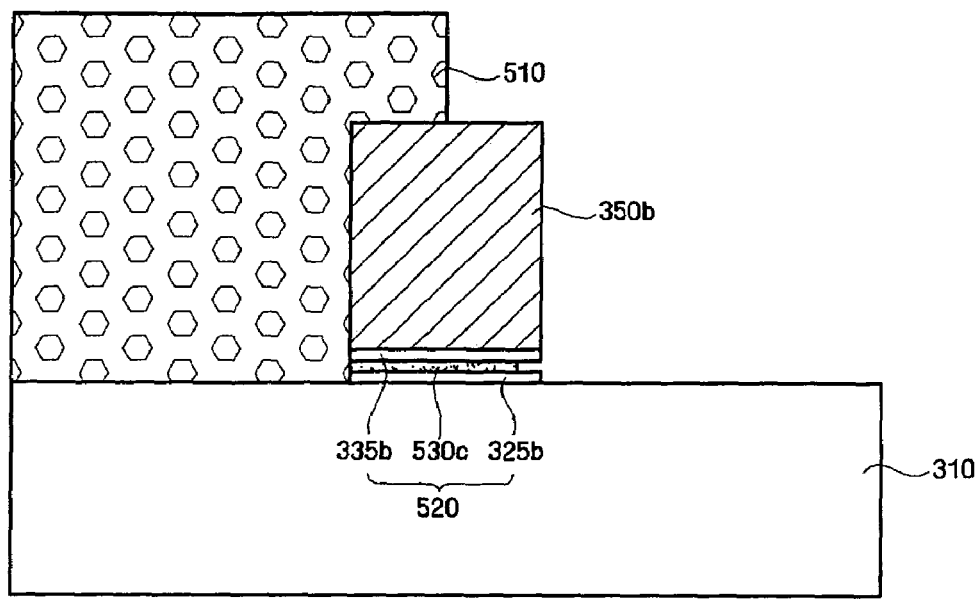
FIGS. 6A-6B are cross-sectional illustrations of a second process for forming a non-volatile memory device having a SONOS-type charge trapping structure in which a charge trapping layer is recessed on one of the source and drain sides of the gate, in accordance with the present invention.
Figure 6B:
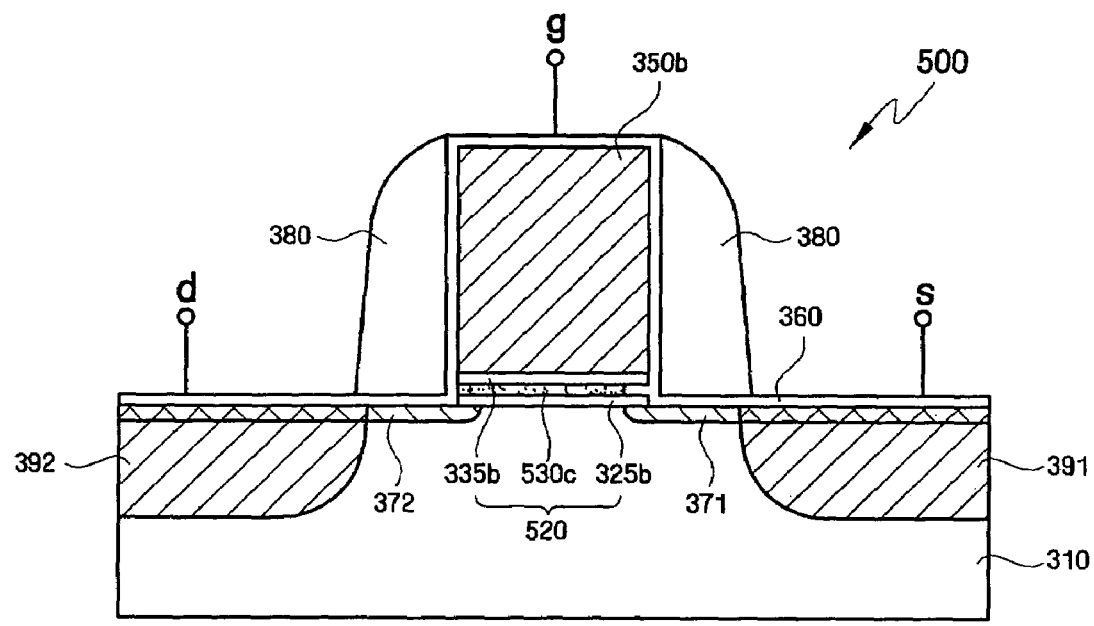

FIGS. 6A-6B are cross-sectional illustrations of a second process for forming a non-volatile memory device having a SONOS-type charge trapping structure in which the charge trapping layer is recessed on only one of the source and drain sides of the gate, for example on the source side of the gate, in accordance with the present invention. The second process is substantially the same as that of the first process, except that during the step of selective etching of the charge trapping layer 530c, a photoresist pattern 510 is applied to the drain side of the structure, to protect the drain side of the charge trapping layer 530c from being selectively etched, while the source side of the charge trapping layer 530c is selectively etched to form a recess in the manner described above, as shown in FIG. 6A. Following selective etching of the charge trapping layer 530c, the steps illustrated above in FIGS. 5D-5F are performed to result in the structure illustrated in FIG. 6B having a charge trapping layer 530c with a recess formed on only the source side of the layer 530c. The embodiment of FIG. 6 is particularly applicable where asymmetry exists between the source and drain of the transistor, for example where the source and drain are different in doping concentration, and in profile. In an application where a recess in the charge trapping layer on both source and drain sides is permissible, fabrication according to the embodiment of FIGS. 5A-5F is preferred, since such a process does not require the additional masking step shown in FIG. 6A.

Figure 7A:
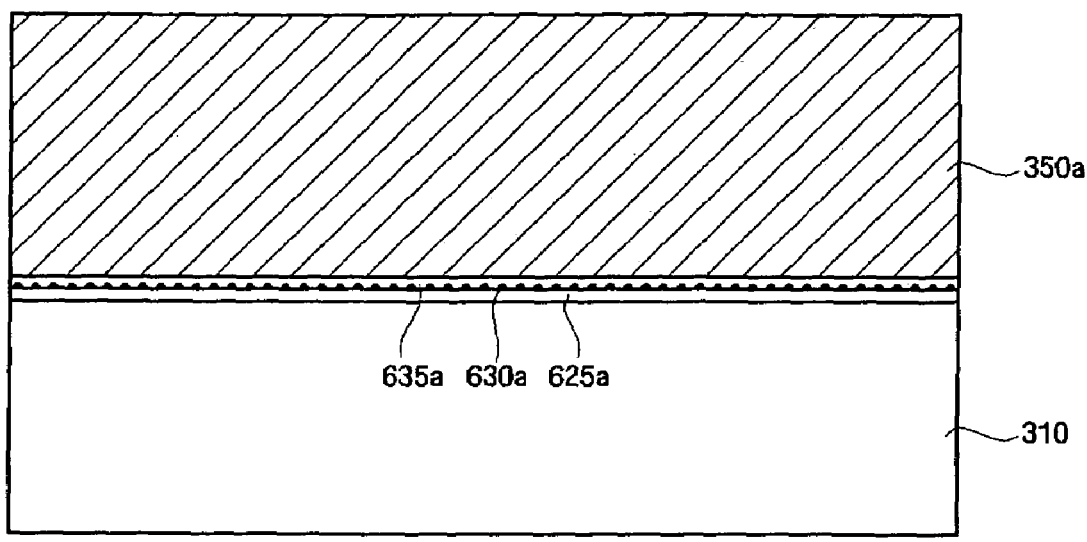
FIGS. 7A-7G are cross-sectional illustrations of a third process for forming a non-volatile memory device having a charge trapping structure in the form of a quantum dot array, in which a charge trapping layer is recessed on both source and drain sides of the gate, in accordance with the present invention.

FIGS. 7A-7G are cross-sectional illustrations of a third process for forming a non-volatile memory device having a charge trapping structure in the form of a quantum dot array, in which a charge trapping layer is recessed on both source and drain sides of the gate, for example on the source side of the gate, in accordance with the present invention. With reference to FIG. 7A, a first dielectric 625a for a tunneling layer, a quantum dot array 630a for a charge trapping layer and a second dielectric 635a for a blocking layer are sequentially provided on the substrate 310. In one embodiment, the first dielectric layer 625a comprises a silicon oxide or silicon oxynitride material, for example formed by rapid thermal processing (RTP), chemical vapor deposition (CVD), a furnace process, or other suitable deposition or growth process, at a depth on the order of approximately 30 to 50 Angstroms. The quantum dot array 630a comprises, in one exemplary embodiment, a polysilicon quantum dot array applied to an upper surface of the first dielectric layer 625 using a mixture of dicholorsilane (DCS) and hydrogen gas ($H_2$) applied using LPCVD or other suitable deposition process, at a temperature in the range of approximately 500 C. to 700 C. In another exemplary embodiment, the quantum dot array 630a comprises a silicon nitride quantum dot array, formed by nitridation of the aforementioned polysilicon quantum dot array. In an optional process, the quantum dots are oxidized, for reducing their respective diameters. The second dielectric layer 635a comprises a silicon oxide material, for example formed by CVD, LPCVD, or other suitable deposition or growth process, to a depth on the order of approximately 50 to 150 Angstroms. A layer of conductive material 350a suitable for forming a gate electrode is next deposited on the resulting structure. In one embodiment, the conductive material layer 350a comprises a polysilicon material, a metal material, or a combination thereof. A top portion of the conductive material layer 350a may be optionally treated to form a positively doped polysilicon-silicide layer. The conductive material layer 350a, is applied, for example, using CVD or LPCVD, to a depth on the order of approximately 80 to 2000 Angstroms.

Figure 7B:
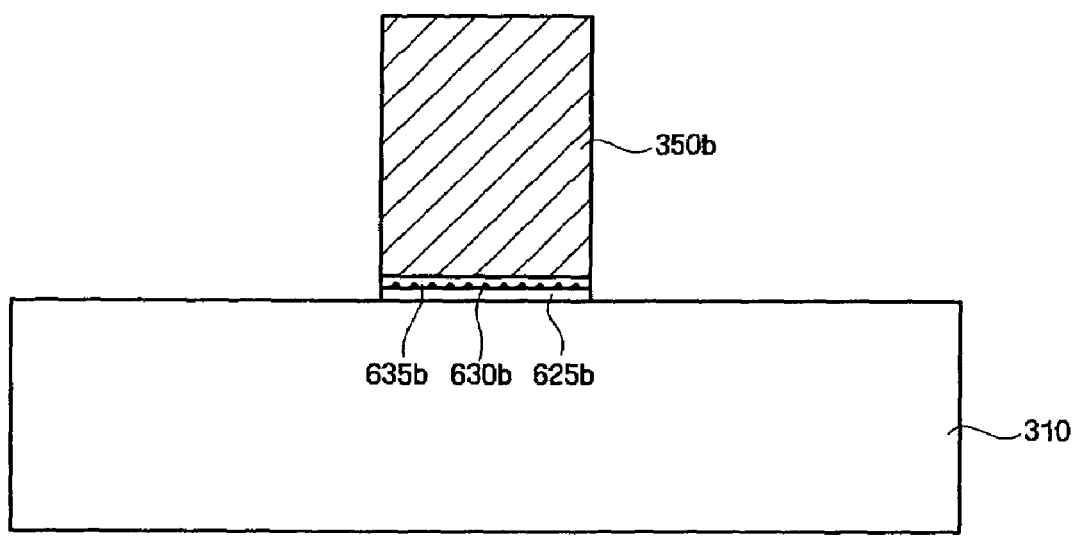

With reference to FIG. 7B, the resulting structure is sequentially patterned using standard photolithographic patterning techniques to form a gate electrode 350b, a blocking layer 635b, a quantum dot array 630b, and a tunneling layer 625b.

Figure 7C:
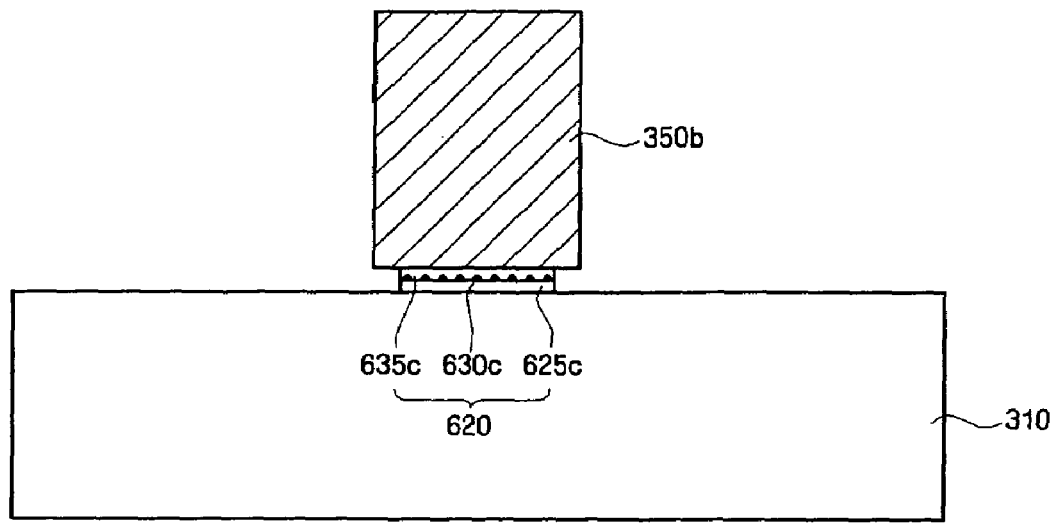

With reference to FIG. 7C, a selective etching process is performed on the resulting structure that results in the selective etching of an outer portion of the charge trapping structure 620, including charge trapping layer 630b in the form of a quantum dot array. In one embodiment, in the case where the tunneling layer 625b and the blocking layer 635b comprise silicon oxide or silicon oxynitride, a wet etchant comprising HF is suitable for increasing etch selectivity. Following etch of the charge trapping structure 620, a recess is formed at the edges of the charge trapping structure 620 including the charge trapping layer 630c, the tunneling layer 625b, and the blocking layer 635b.

Figure 7D:
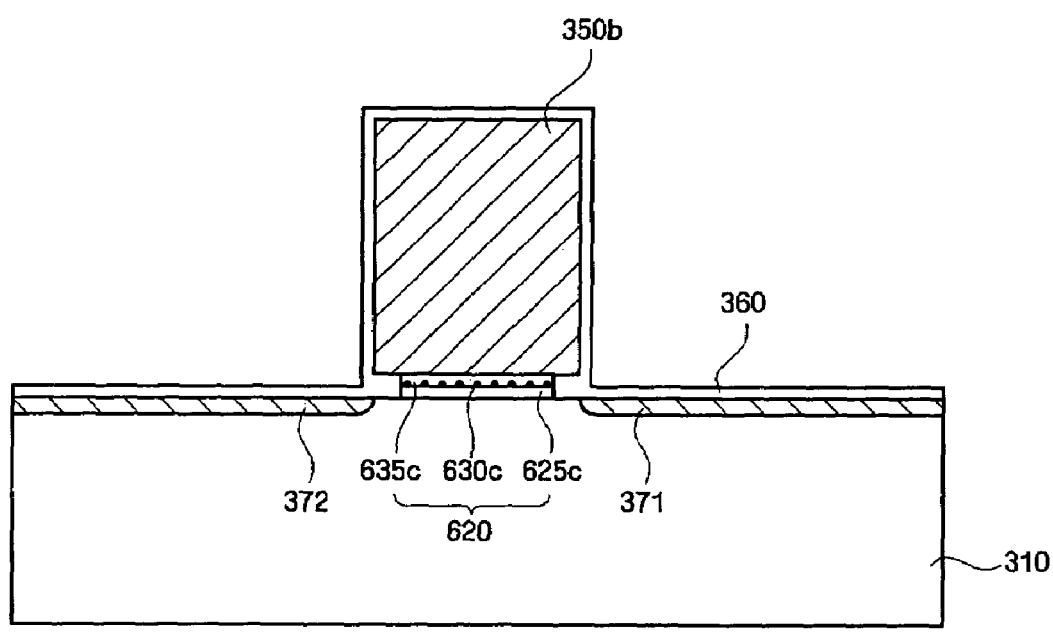

With reference to FIG. 7D, ion implantation is performed on the resulting structure, to form lightly doped source/drain regions 371, 372 of source/drain regions of the device. The resulting lightly doped source/drain regions 371, 372 are self-aligned with the gate electrode 350b. The self-aligned lightly doped source/drain regions can be formed following the selective etching of the charge trapping layer 630c, or optionally, can be formed prior to the selective etching of the charge trapping layer 630c. A gate insulation layer 360 is next formed on the resulting structure. In one embodiment, the gate insulation layer 360 comprises a silicon oxide material, for example formed by CVD, LPCVD, or other suitable deposition or growth process, to a depth on the order of approximately 50 to 100 Angstroms. The recessed region of the charge trapping structure 620 is partially or completely filled by the applied gate insulation layer 360.

Figure 7E:
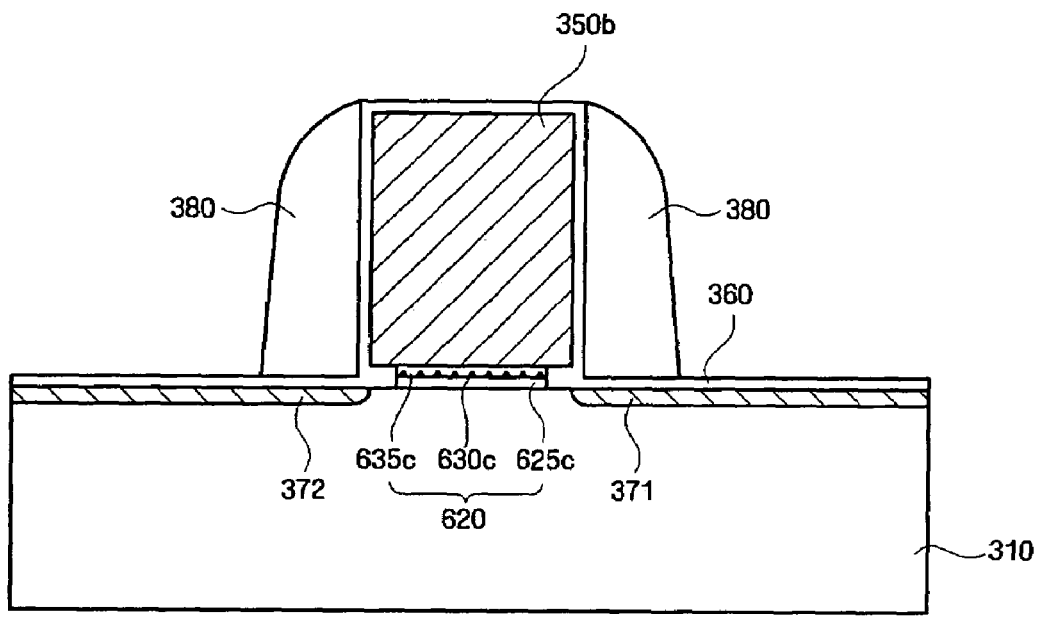

With reference to FIG. 7E, lateral spacers 380 are formed on both source and drain sides of the gate electrode 350b. In one embodiment, a silicon nitride layer is provided on the resulting structure for example formed by CVD, or other suitable deposition or growth process, to a depth on the order of approximately 500 to 700 Angstroms. An etch-back process is then performed according to conventional techniques to form the lateral spacers 380.

Figure 7F:
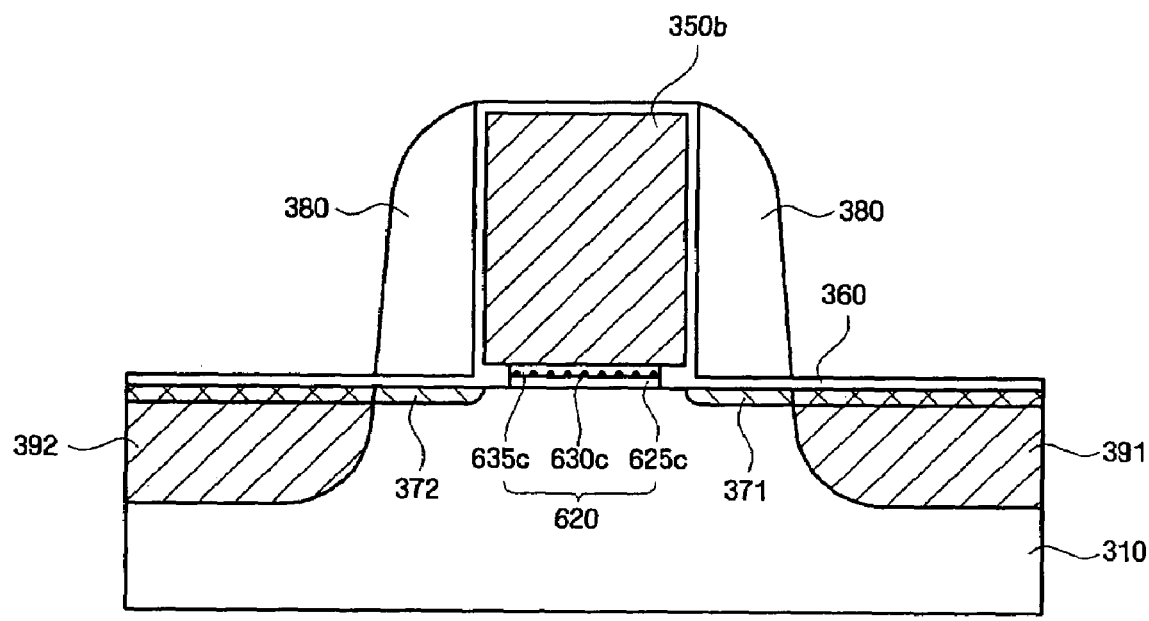

With reference to FIG. 7F, ion implantation is performed on the resulting structure, to form highly doped source/drain regions 391, 392 of the source/drain regions of the device. The resulting highly doped source/drain regions 391, 392 are self-aligned with the lateral spacers 380.

Figure 7G:
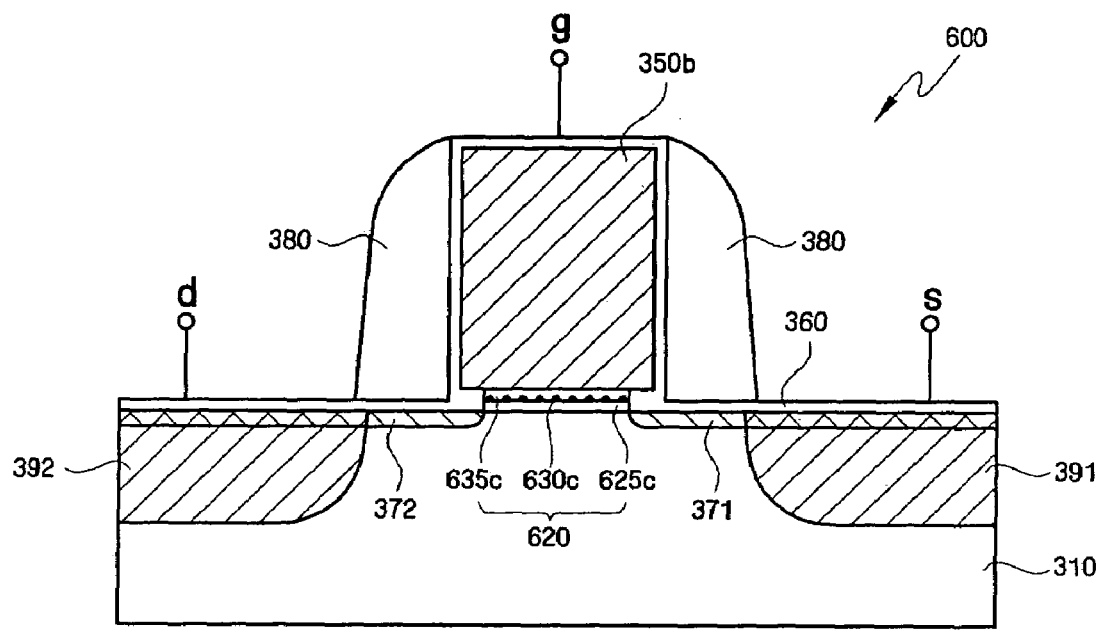

With reference to FIG. 7G, a diffusion process is performed on the resulting structure, for example using RTP at a temperature of approximately 1000 C. or greater for a time period of a few seconds, in order to diffuse the lightly doped source/drain regions 371, 372 further inward, into the channel region, so that the gate electrode 350b overlaps the lightly doped source/drain regions 371, 372. In one embodiment, the lightly doped source/drain regions 371, 372 are extended so that their inner edges are approximately aligned with the recessed edges of the charge trapping structure 620. Such alignment ensures cancellation of trapped electrons by hole migration during an erase operation. A smaller recess would allow a portion of the charge trapping structure 620 to overlap the lightly-doped source/drain regions 371, 372, which could decrease the likelihood of full electron cancellation during an erase operation. A deeper recess would result in removal of a valuable portion of the charge trapping structure 620 at which hole cancellation is needed.

As a result of the third process for fabricating a non-volatile memory device, the resulting device 600 has a recessed charge trapping layer, which offers the advantages described above.

Figure 8A:
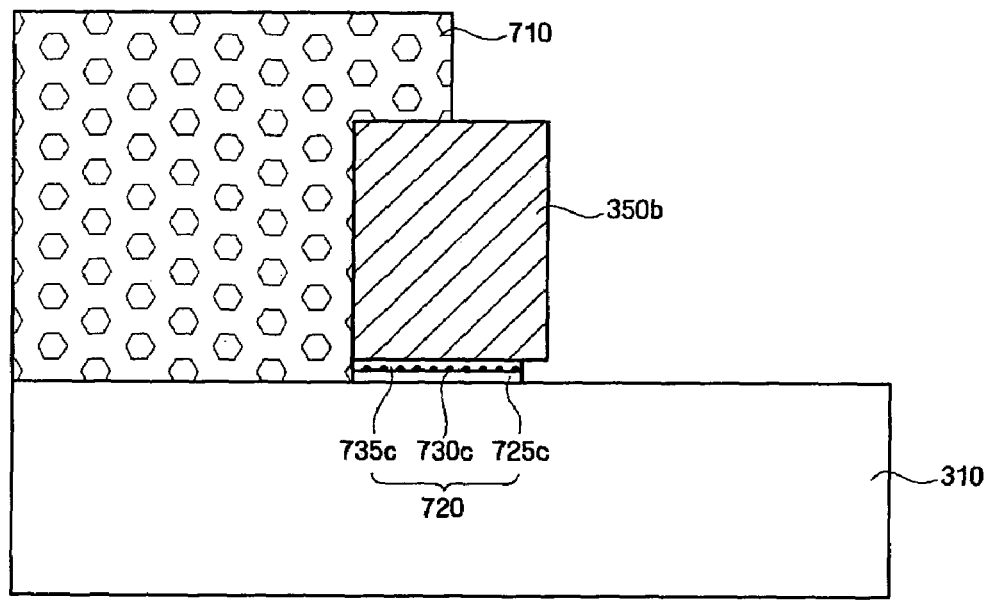
FIGS. 8A-8B are cross-sectional illustrations of a fourth process for forming a non-volatile memory device having a charge trapping structure in the form of a quantum dot array, in which a charge trapping layer is recessed on one of the source and drain sides of the gate, in accordance with the present invention.
Figure 8B:
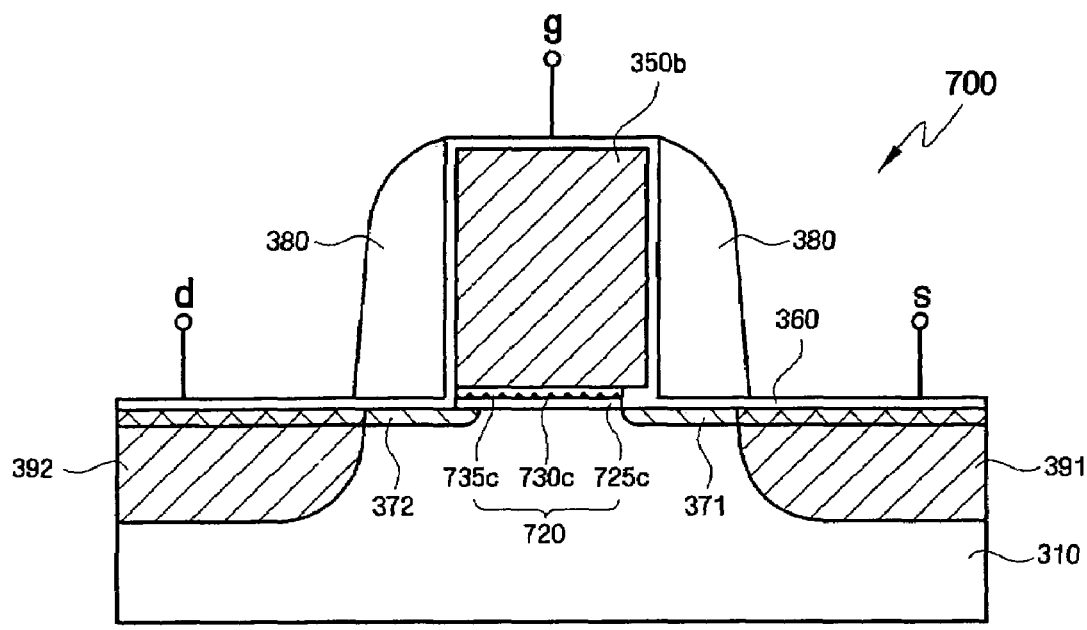

FIGS. 8A-8B are cross-sectional illustrations of a fourth process for forming a non-volatile memory device having a charge trapping structure in the form of a quantum dot array, in which the charge trapping structure is recessed on only one of the source and drain sides of the gate, for example on the source side of the gate, in accordance with the present invention. The fourth process is substantially the same as that of the third process, except that during the step of selective etching of the charge trapping structure 720, a photoresist pattern 710 is applied to the drain side of the structure, to protect the drain side of the charge trapping structure 720 from being selectively etched, while the source side of the charge trapping structure 720 is selectively etched to form a recess in the manner described above, as shown in FIG. 8A. Following selective etching of the charge trapping structure 720, the steps illustrated in FIGS. 7D-7G are performed to result in the structure illustrated in FIG. 8B having a charge trapping structure 720 with a recess formed on only the source side of the structure 720. The embodiment of FIG. 8A is particularly applicable where asymmetry exists between the source and drain of the transistor, for example where the source and drain are different in doping concentration, and in profile. In an application where a recess in the charge trapping layer on both source and drain sides is permissible, fabrication according to the embodiment of FIGS. 7A-7G is preferred, since such a process does not require the additional masking step shown in FIG. 8A.

Figure 9A:
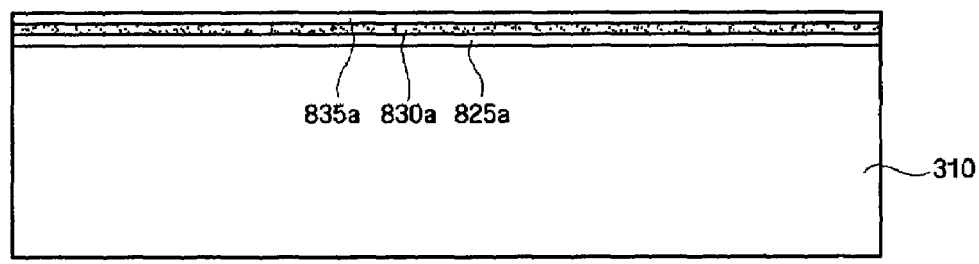
FIGS. 9A-9D are cross-sectional illustrations of a fifth process for forming a non-volatile memory device having a localized SONOS-type charge trapping structure in which a charge trapping layer is recessed on one of the source and drain sides of the gate, in accordance with the present invention.

FIGS. 9A-9D are cross-sectional illustrations of a fifth process for forming a non-volatile memory device having a localized-SONOS-type charge trapping structure in which a charge trapping layer is recessed on one of the source and drain sides, in accordance with the present invention. With reference to FIG. 9A, a first dielectric 825a for a tunneling layer, a second dielectric 830a for a charge trapping layer and a third dielectric 835a for a blocking layer are sequentially provided on the substrate 310, for example in the manner corresponding to the above-described embodiments.

Figure 9B:
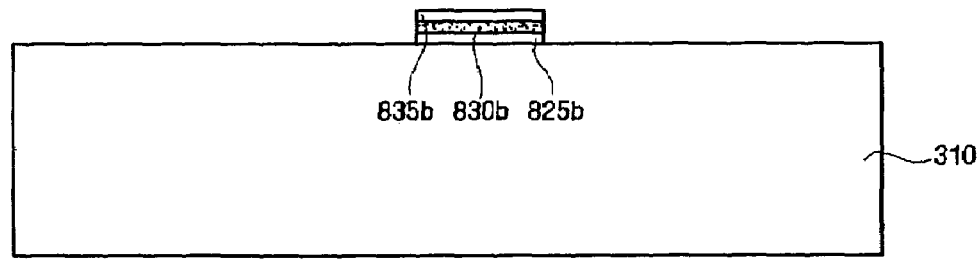

With reference to FIG. 9B, the resulting structure is patterned using standard photolithographic patterning techniques to form a blocking layer 835b, a charge trapping layer 830b, and a tunneling layer 825b.

Figure 9C:
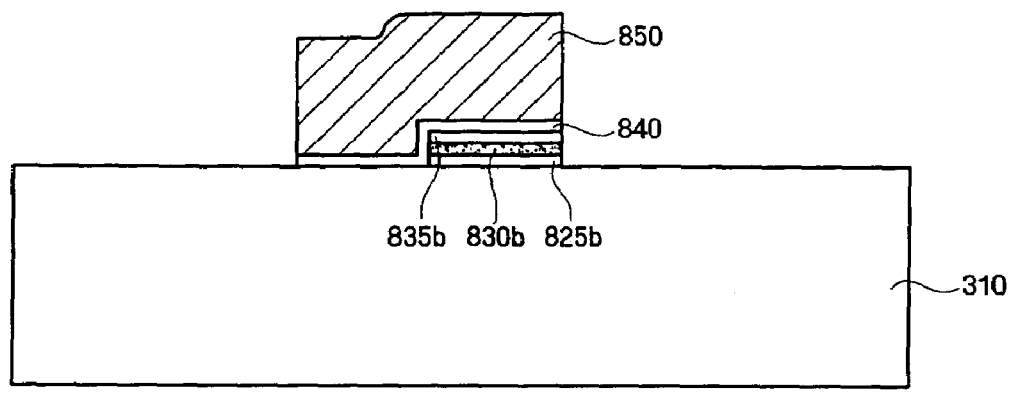

With reference to FIG. 9C, a fourth dielectric layer for forming a coupling layer 840 is provided on the resulting structure, for example comprising a silicon oxide material, for example formed by CVD, LPCVD, or other suitable deposition or growth process, to a depth on the order of approximately 50 to 100 Angstroms. A layer of conductive material suitable for forming a gate electrode is next deposited on the resulting structure and the layer of conductive material and fourth dielectric layer are patterned using a conventional photolithographic patterning process so as to form a gate electrode 850 on a coupling layer 840 over the substrate 310 and over the charge trapping structure 820. In one embodiment, the conductive material layer 850 comprises a polysilicon material, a metal material, or a combination thereof. A top portion of the conductive material layer 850 may be optionally treated to form a positively doped polysilicon-silicide layer. The conductive material layer is applied, for example, using CVD or LPCVD, to a depth on the order of approximately 80 to 2000 Angstroms.

Figure 9D:
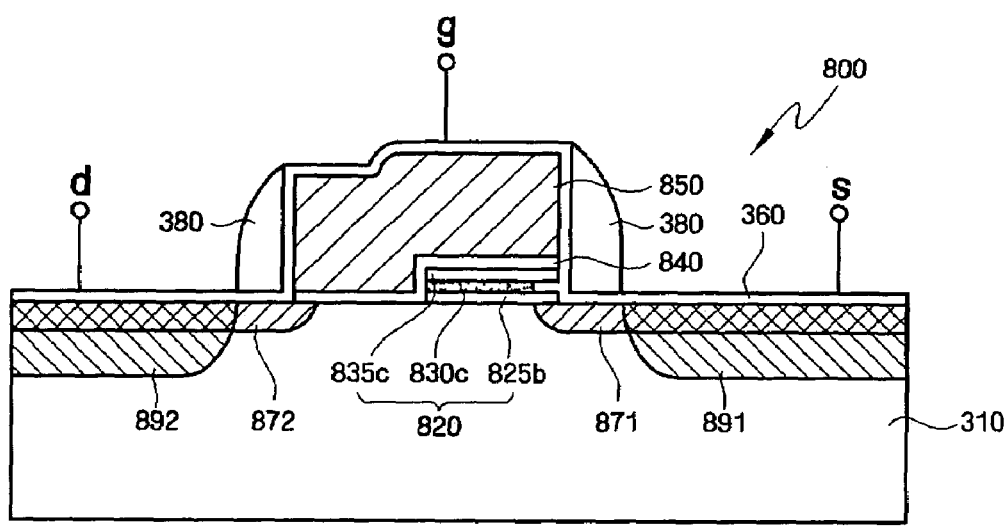

With reference to FIG. 9D, a selective etching process is performed on the resulting structure that results in the selective etching of an exposed outer portion of the charge trapping layer 830b. In one embodiment, in the case where the charge trapping layer 830b comprises silicon nitride or silicon oxynitride, a wet etchant comprising phosphoric oxide ($H_3PO_4$) is suitable for increasing etch selectivity. Following etch of the charge trapping layer 830c, a recess is formed at the exposed edge of the charge trapping layer 830c, as shown.

Ion implantation is performed on the resulting structure, to form lightly doped source/drain regions 871, 872 of source/drain regions of the device. The resulting lightly doped source/drain regions 871, 872 are self-aligned with the gate electrode 850. The self-aligned lightly doped source/drain regions can be formed following the selective etching of the charge trapping layer 830c, or optionally, can be formed prior to the selective etching of the charge trapping layer 830c. A gate insulation layer 360 is next formed on the resulting structure. In one embodiment, the gate insulation layer 360 comprises a silicon oxide material, for example formed by CVD, LPCVD, or other suitable deposition or growth process, to a depth on the order of approximately 50 to 100 Angstroms. The recessed region of the charge trapping layer 830c is partially or completely filled by the applied gate insulation layer 360.

Lateral spacers 380 are formed on both source and drain sidewalls of the gate electrode 850. In one embodiment, a silicon nitride layer is provided on the resulting structure for example formed by CVD, or other suitable deposition or growth process, to a depth on the order of approximately 500 to 700 Angstroms. An etch-back process is then performed according to conventional techniques to form the lateral spacers 380.

Ion implantation is then performed on the resulting structure, to form highly doped source/drain regions 891, 892 of the source/drain regions of the device. The resulting highly doped source/drain regions 891, 892 are self-aligned with the lateral spacers 380. A diffusion process is performed on the resulting structure, for example using RTP at a temperature of approximately 1000 C. or greater for a time period of a few seconds, in order to diffuse the lightly doped source/drain regions 871, 872 further inward, into the channel region, so that the gate electrode 850 overlaps the lightly doped source/drain regions 871, 872.

As a result of the fifth process for fabricating a non-volatile memory device, the resulting device 800 has a recessed charge trapping layer, which offers the advantages described above.

Figure 10A:
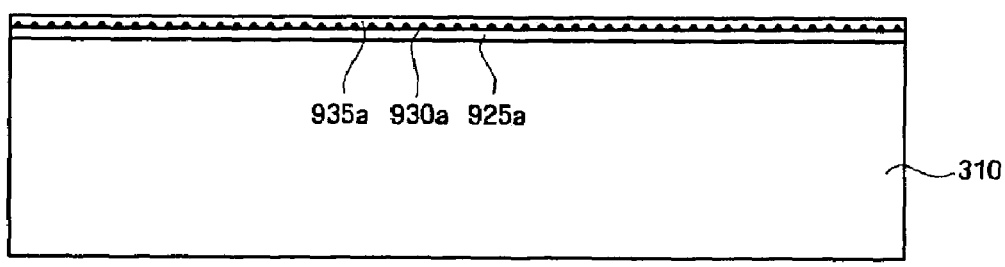
FIGS. 10A-10D are cross-sectional illustrations of a sixth process for forming a non-volatile memory device having a localized charge trapping structure in the form of a quantum dot array, in which a charge trapping layer is recessed on one of the source and drain sides, in accordance with the present invention.

FIGS. 10A-10D are cross-sectional illustrations of a sixth process for forming a non-volatile memory device having a localized charge trapping structure in the form of a quantum dot array, in which a charge trapping layer is recessed on one of the source and drain sides of the gate, for example on the source side of the gate, in accordance with the present invention. With reference to FIG. 10A, a first dielectric 925a for a tunneling layer, a quantum dot array 930a for a charge trapping layer and a second dielectric 935a for a blocking layer are sequentially provided on the substrate 310, for example in the manner corresponding to the above-described embodiments.

Figure 10B:
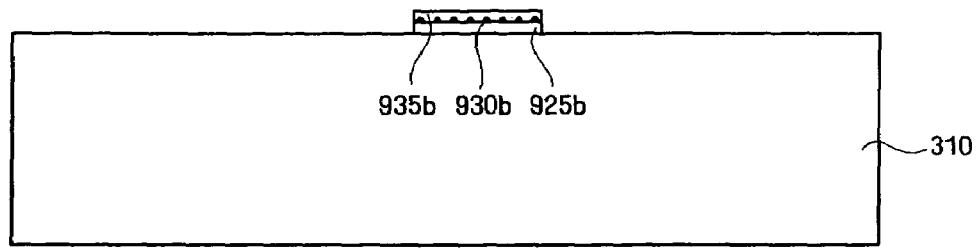

With reference to FIG. 10B, the resulting structure is patterned using standard photolithographic patterning techniques to form a blocking layer 935b, a charge trapping layer 930b, and a tunneling layer 925b.

Figure 10C:
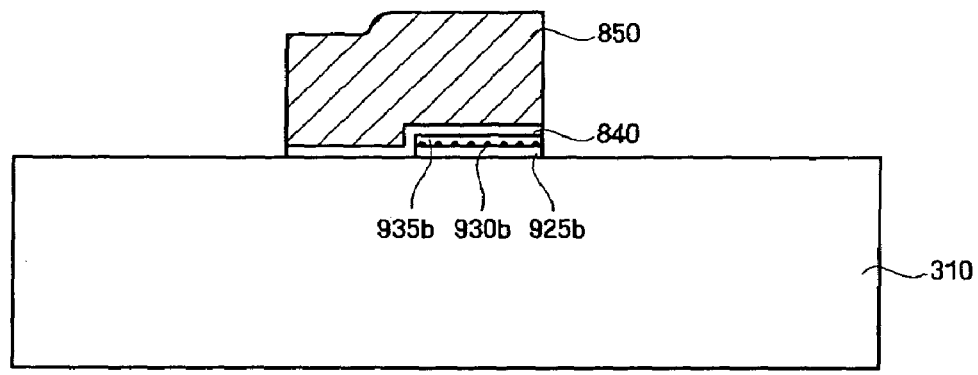

With reference to FIG. 10C, a third dielectric layer for forming a coupling layer 840 is provided on the resulting structure, for example comprising a silicon oxide material, for example formed by CVD, LPCVD, or other suitable deposition or growth process, to a depth on the order of approximately 50 to 100 Angstroms. A layer of conductive material suitable for forming a gate electrode is next deposited on the resulting structure and the layer of conductive material and fourth dielectric layer are patterned using a conventional photolithographic patterning process so as to form a gate electrode 850 on a coupling layer 840 over the substrate 310 and over the charge trapping structure 920. In one embodiment, the conductive material layer 850 comprises a polysilicon material, a metal material, or a combination thereof. A top portion of the conductive material layer 850 may be optionally treated to form a positively doped polysilicon-silicide layer. The conductive material layer is applied, for example, using CVD or LPCVD, to a depth on the order of approximately 80 to 2000 Angstroms.

Figure 10D:
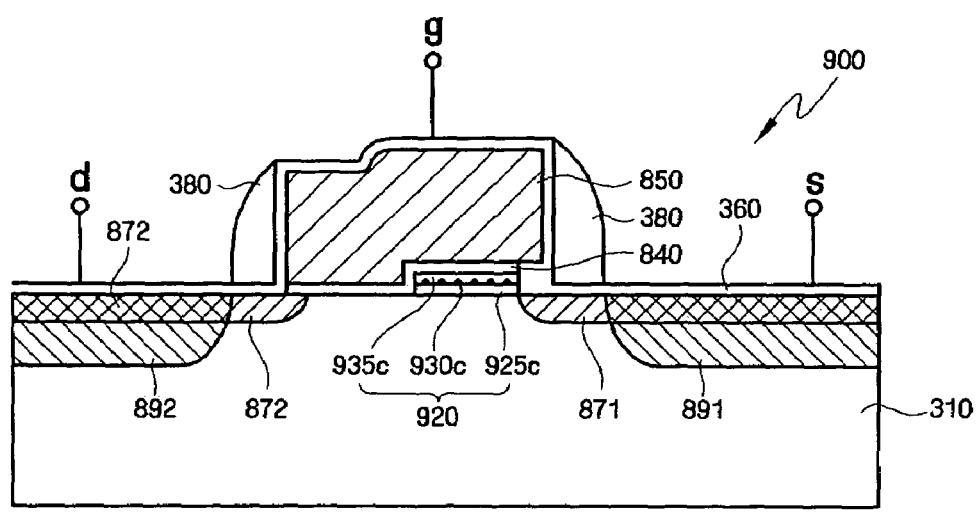

With reference to FIG. 10D, a selective etching process is performed on the resulting structure that results in the selective etching of an exposed outer portion of the charge trapping structure 920. In one embodiment, in the case where the tunneling layer 925c and blocking layer 935c comprise silicon oxide or silicon oxynitride, a wet etchant comprising HF is suitable for increasing etch selectivity. Following etch of the charge trapping structure 920, a recess is formed at the exposed edge of the charge trapping structure 920.

Ion implantation is performed on the resulting structure, to form lightly doped source/drain regions 871, 872 of source/drain regions of the device. The resulting lightly doped source/drain regions 871, 872 are self-aligned with the gate electrode 850. The self-aligned lightly doped source/drain regions can be formed following the selective etching of the charge trapping layer 930c, or optionally, can be formed prior to the selective etching of the charge trapping layer 930c. A gate insulation layer 360 is next formed on the resulting structure. In one embodiment, the gate insulation layer 360 comprises a silicon oxide material, for example formed by CVD, LPCVD, or other suitable deposition or growth process, to a depth on the order of approximately 50 to 100 Angstroms. The recessed region of the charge trapping structure 920 is partially or completely filled by the applied gate insulation layer 360.

Lateral spacers 380 are formed on both source and drain sides of the gate electrode 850. In one embodiment, a silicon nitride layer is provided on the resulting structure for example formed by CVD, or other suitable deposition or growth process, to a depth on the order of approximately 500 to 700 Angstroms. An etch-back process is then performed according to conventional techniques to form the lateral spacers 380.

Ion implantation is performed on the resulting structure, to form highly doped source/drain regions 891, 892 of the source/drain regions of the device. The resulting highly doped source/drain regions 891, 892 are self-aligned with the lateral spacers 380. A diffusion process is then performed on the resulting structure, for example using RTP at a temperature of approximately 1000 C or greater for a time period of a few seconds, in order to diffuse the lightly doped source/drain regions 871, 872 further inward, into the channel region, so that the gate electrode 850 overlaps the lightly doped source/drain regions 871, 872. In one embodiment, the lightly doped source/drain regions 871, 872 are extended so that the inner edge of the lightly doped source region 871 is approximately aligned with the recessed edges of the charge trapping structure 920.

As a result of the sixth process for fabricating a non-volatile memory device, the resulting device 900 has a recessed charge trapping layer, which offers the advantages described above.

FIGS. 11A-11F are cross-sectional illustrations of a seventh process for forming a halo-type non-volatile memory device having a SONOS-type charge trapping structure in which a charge trapping layer is recessed on both source and drain sides, in accordance with the present invention.

Figure 11A:
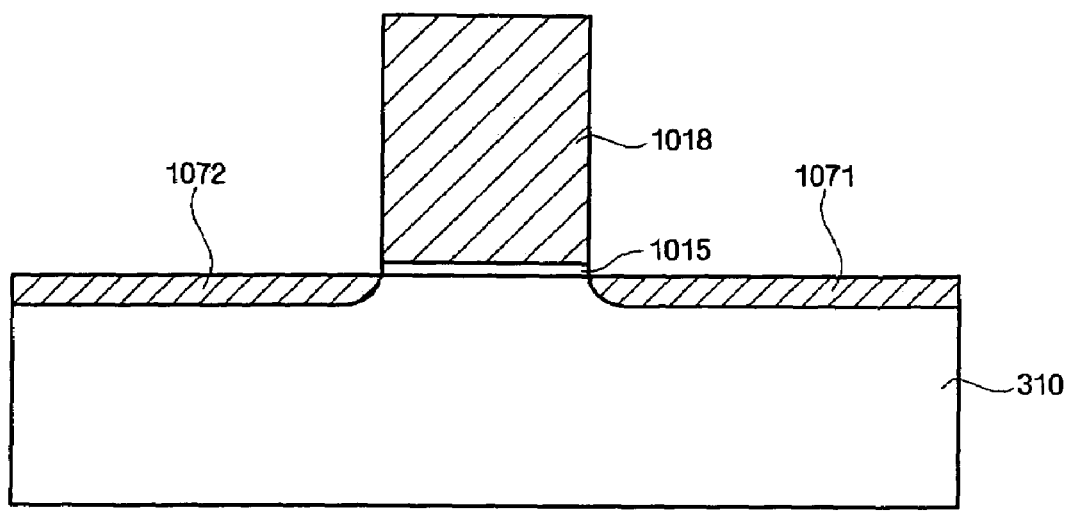
FIGS. 11A-11F are cross-sectional illustrations of a seventh process for forming a halo-type non-volatile memory device having a SONOS-type charge trapping structure in which a charge trapping layer is recessed on both source and drain sides, in accordance with the present invention.

With reference to FIG. 11A, a gate insulation layer is formed on a substrate. In one embodiment, the gate insulation layer comprises a silicon oxide material, for example formed by CVD, LPCVD, or other suitable deposition or growth process, to a depth on the order of approximately 50 to 100 Angstroms. A layer of conductive material suitable for forming a gate electrode is provided on the gate insulation layer. In one embodiment, the conductive material layer comprises a polysilicon material, a SiGe-based material, a Ge-based material or a combination thereof. A top portion of the conductive material layer may be optionally treated to form a positively doped polysilicon-silicide layer. The conductive material layer, is applied, for example, using CVD or LPCVD, to a depth on the order of approximately 80 to 2000 Angstroms. The gate insulation layer and conductive material layer are patterned using conventional photolithography patterning techniques to form a gate dielectric layer 1015 and a primary gate electrode 1018.

Ion implantation is performed on the resulting structure, to form lightly doped source/drain regions 1071, 1072 of source/drain regions of the device. The resulting lightly doped source/drain regions 1071, 1072 are self-aligned with the primary gate electrode 1018. A diffusion process is performed on the resulting structure, for example using RTP at a temperature of approximately 1000 C. or greater for a time period of a few seconds, in order to diffuse the lightly doped source/drain regions 1071, 1072 further-inward, into the channel region, so that the primary gate electrode 1018 overlaps the lightly doped source/drain regions 1071, 1072.

Figure 11B:
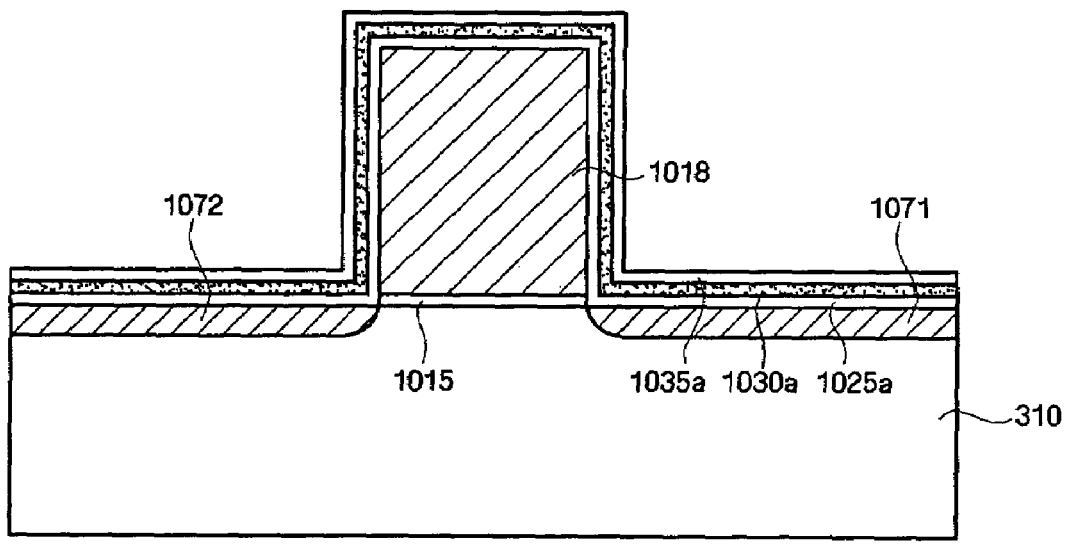

With reference to FIG. 11B, a first dielectric 1025a for a tunneling layer, a second dielectric 1030a for a charge trapping layer and a third dielectric 1035a for a blocking layer are sequentially provided on the primary gate electrode 1018 and substrate 310, for example in the manner described above with reference to FIG. 5A.

Figure 11C:
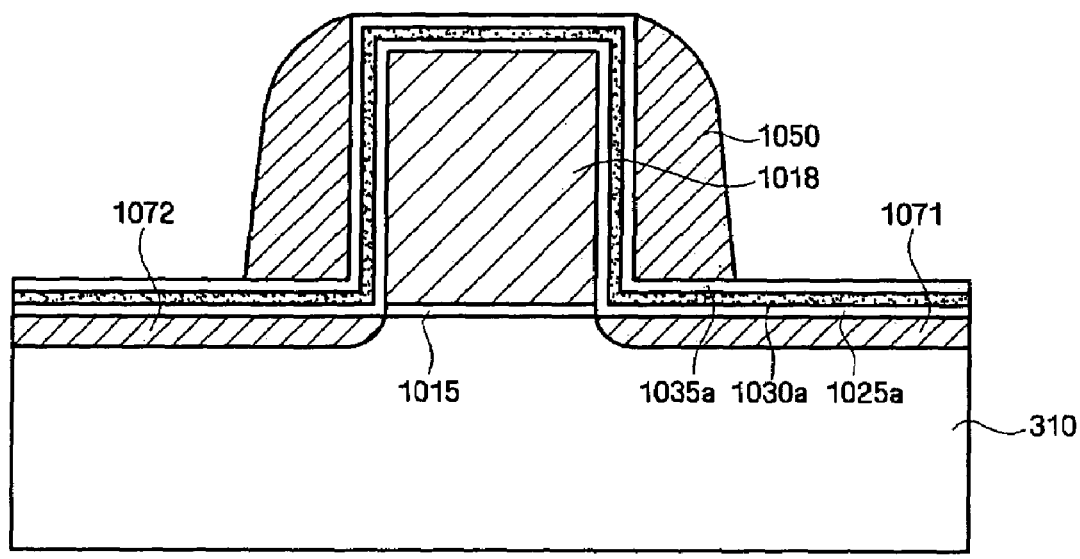

With reference to FIG. 11C, lateral conductive spacers 1050 are formed on both source and drain sidewalls of the primary gate electrode 1018. In one embodiment for forming the conductive spacers, a conductive material layer, for example comprising a polysilicon material, a SiGe-based material, a Ge-based material or a combination thereof, is provided on the resulting structure for example formed by CVD, or other suitable deposition or growth process, to a depth on the order of approximately 500 to 700 Angstroms. An etch-back process is then performed according to conventional techniques to form the lateral conductive spacers 1050, which provide the function of side gate electrodes for the device.

Figure 11D:
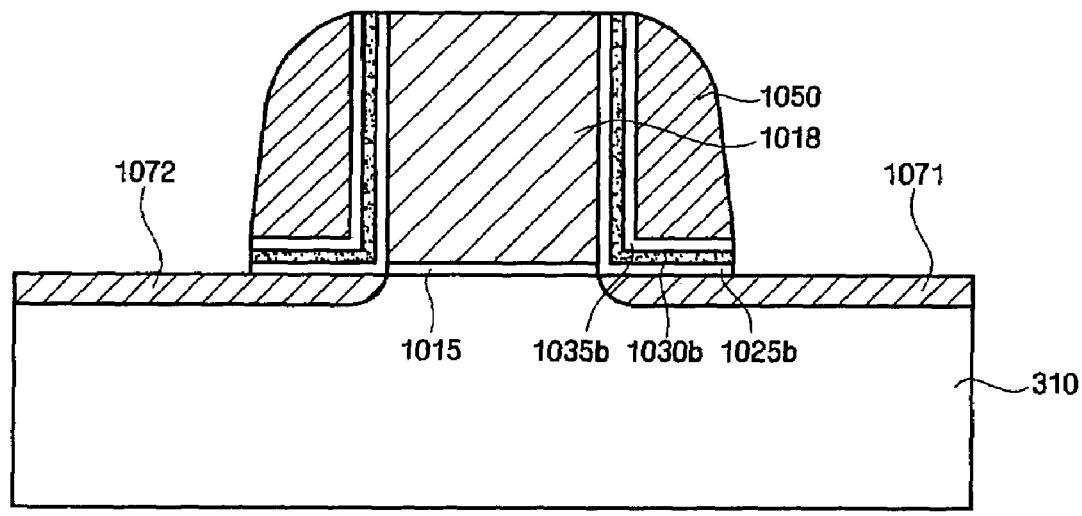

With reference to FIG. 11D, exposed portions of the first, second and third dielectric layers 1025a, 1030a, 1035a are etched so as to form a tunneling layer 1025b, a charge trapping layer 1030b, and a blocking layer 1035b on each side of the primary gate electrode 1018.

Figure 11E:
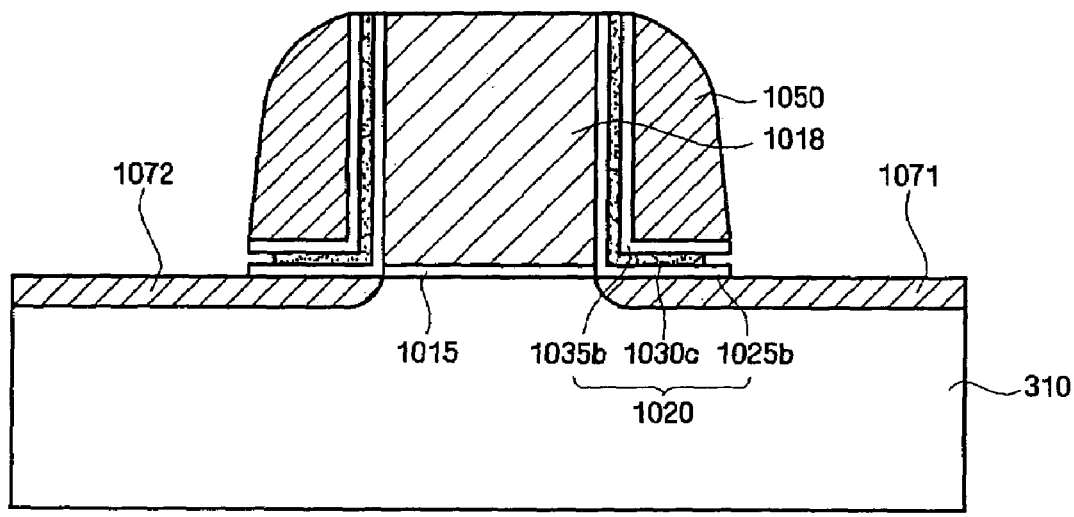

With reference to FIG. 11E, a selective etching process is performed on the resulting structure that results in the selective etching of an exposed outer portion of the charge trapping layer 1030b. In one embodiment, in the case where the charge trapping layer comprises silicon nitride or silicon oxynitride, a wet etchant comprising phosphoric oxide ($H_3PO_4$) is suitable for increasing etch selectivity. Following etch of the charge trapping layer 1030c, a recess is formed at the edges of the charge trapping layer 1030c.

Figure 11F:
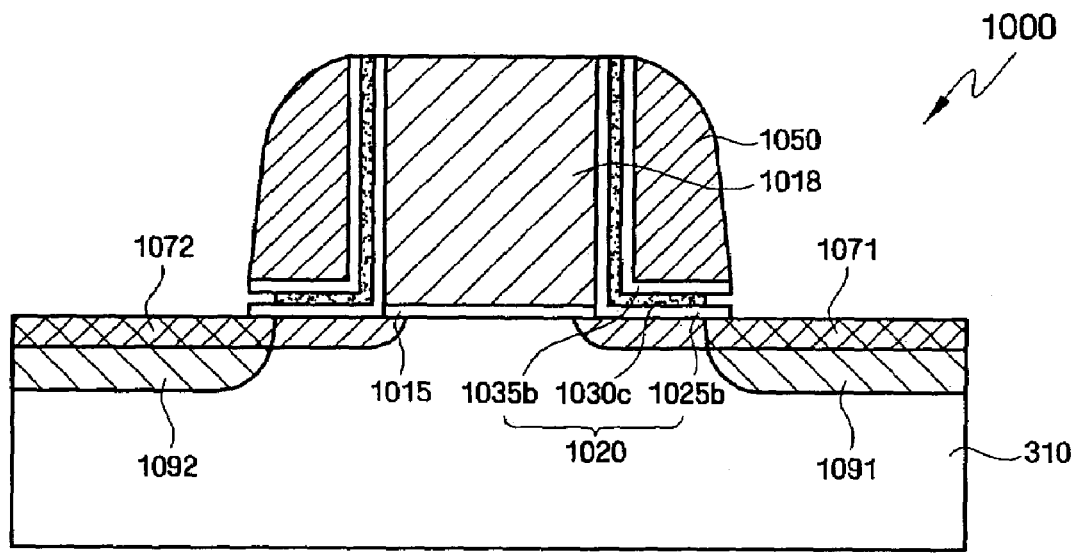

With reference to FIG. 11F, ion implantation is performed on the resulting structure, to form highly-doped source/drain regions 1091, 1092 of the device. The resulting highly-doped source/drain regions 1091, 1092 are self-aligned with the side gate electrodes 1050. The ion implantation for forming highly-doped source/drain regions 1091, 1092 can be performed following the selective etching of the charge trapping layer 1030c, or optionally, can be performed prior to the selective etching of the charge trapping layer 1030c. A diffusion process is performed on the resulting structure, for example using RTP at a temperature of approximately 1000 C. or greater for a time period of a few seconds, in order to diffuse the lightly doped source/drain regions 1071, 1072 and highly doped source/drain regions 1091, 1092 further inward, into the channel region, so that the side gate electrodes 1050 overlap the highly doped source/drain regions 1091, 1092.

As a result of the seventh process for fabricating a non-volatile memory device, the resulting halo-type device 1000 has a recessed charge trapping layer, which offers the advantages described above.

FIGS. 12A-12F are cross-sectional illustrations of an eighth process for forming a halo-type non-volatile memory device having a charge trapping structure in the form of a quantum dot array, in which a charge trapping layer is recessed on both source and drain sides, in accordance with the present invention.

Figure 12A:
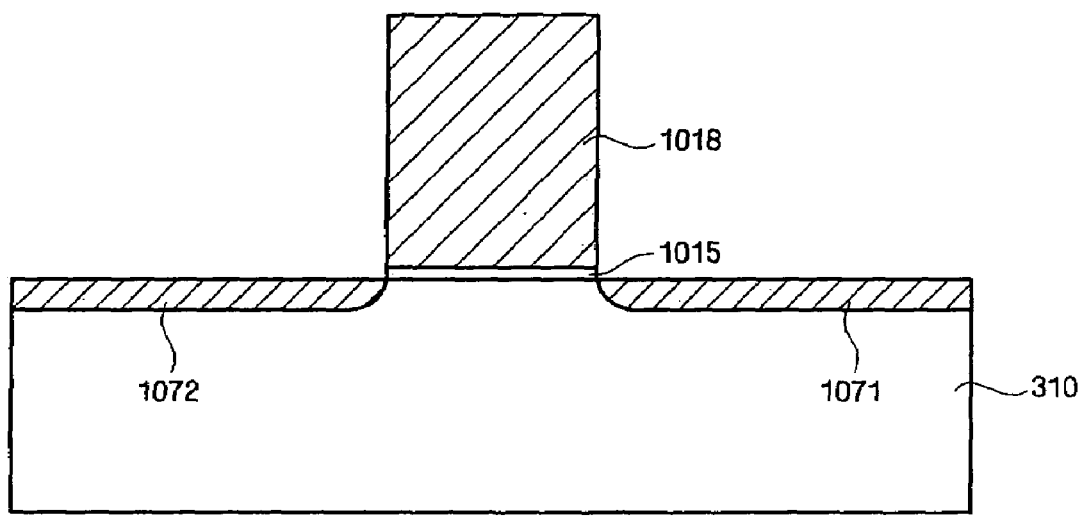
FIGS. 12A-12F are cross-sectional illustrations of an eighth process for forming a halo-type non-volatile memory device having a charge trapping structure in the form of a quantum dot array, in which a charge trapping layer is recessed on both source and drain sides, in accordance with the present invention.

With reference to FIG. 12A, a gate insulation layer is formed on a substrate. In one embodiment, the gate insulation layer comprises a silicon oxide material, for example formed by CVD, LPCVD, or other suitable deposition or growth process, to a depth on the order of approximately 50 to 100 Angstroms. A layer of conductive material suitable for forming a gate electrode is provided on the gate insulation layer. In one embodiment, the conductive material layer comprises a polysilicon material, a SiGe-based material, a Ge-based material or a combination thereof. A top portion of the conductive material layer may be optionally treated to form a positively doped polysilicon-silicide layer. The conductive material layer, is applied, for example, using CVD or LPCVD, to a depth on the order of approximately 80 to 2000 Angstroms. The gate insulation layer and conductive material layer are patterned using conventional photolithography patterning techniques to form a gate dielectric layer 1015 and a primary gate electrode 1018.

Ion implantation is performed on the resulting structure, to form lightly doped source/drain regions 1071, 1072 of source/drain regions of the device. The resulting lightly doped source/drain regions 1071, 1072 are self-aligned with the primary gate electrode 1018.

Figure 12B:
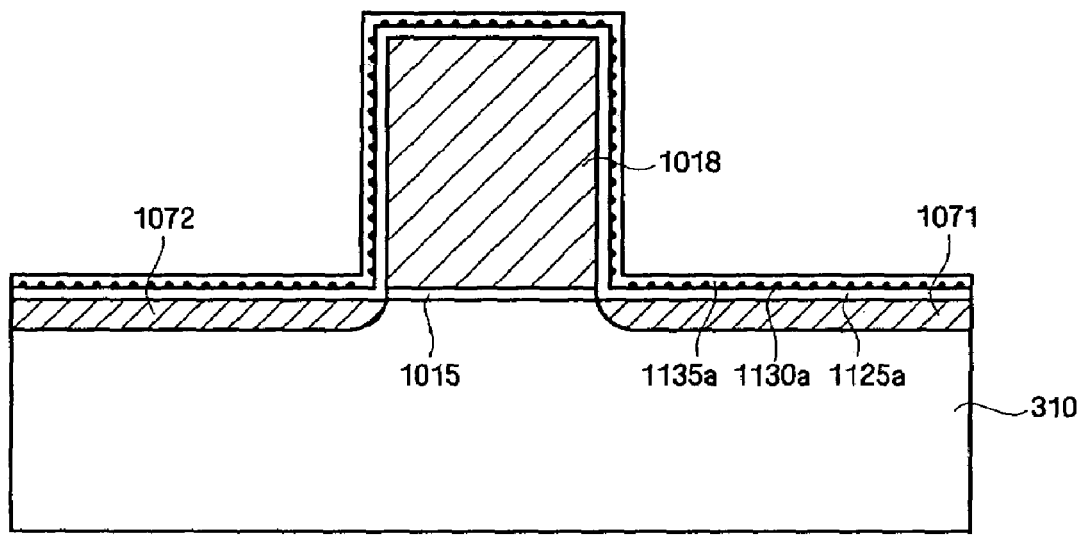

With reference to FIG. 12B, a first dielectric 1125a for a tunneling layer, a charge trapping layer in the form of a quantum dot array 1130a, and a third dielectric 1135a for a blocking layer are sequentially provided on the primary gate electrode 1018 and substrate 310, for example in the manner described above, with reference to FIG. 7A.

Figure 12C:
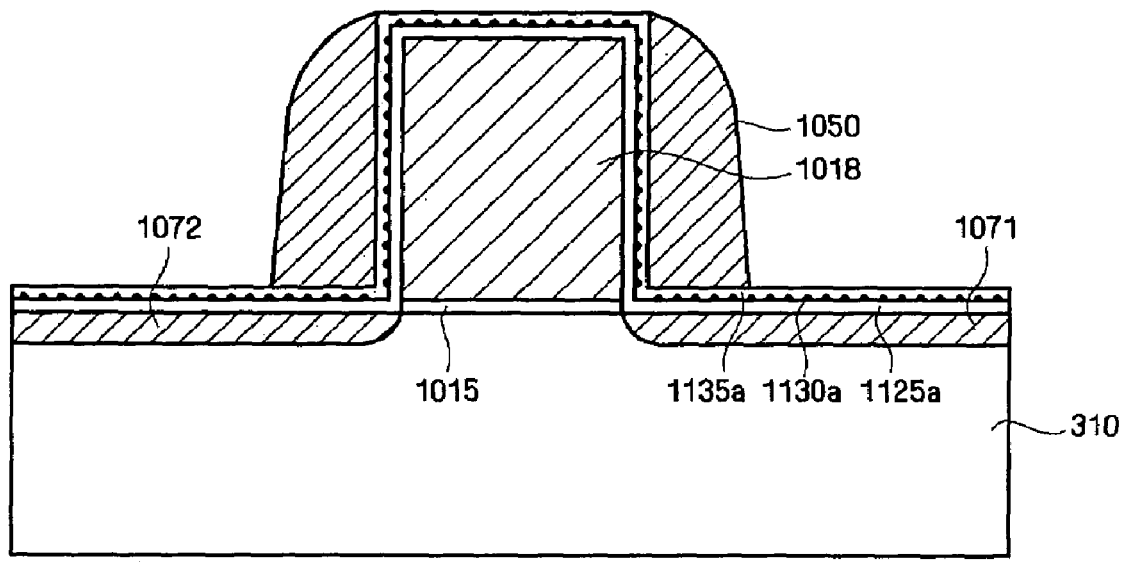

With reference to FIG. 12C, lateral conductive spacers 1050 are formed on both source and drain sidewalls of the primary gate electrode 1018. In one embodiment for forming the conductive spacers, a conductive material layer, for example comprising a polysilicon material, a SiGe-based material, a Ge-based material or a combination thereof, is provided on the resulting structure for example formed by CVD, or other suitable deposition or growth process, to a depth on the order of approximately 500 to 700 Angstroms. An etch-back process is then performed according to conventional techniques to form the lateral conductive spacers 1050, which provide the function of side gate electrodes for the device.

Figure 12D:
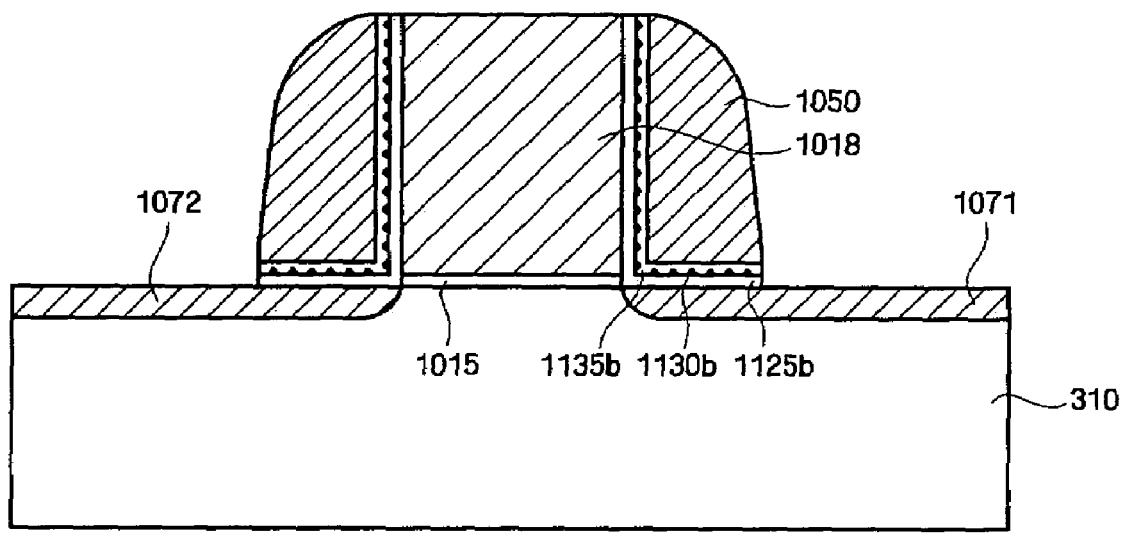

With reference to FIG. 12D, exposed portions of the first dielectric layer 1125a, the quantum dot array 1130a and the second dielectric layer 1135a are etched so as to form a charge trapping structure 1120 comprising a tunneling layer 1125b, a charge trapping layer 1130b, and a blocking layer 1135b on each side of the primary gate electrode 1018.

Figure 12E:
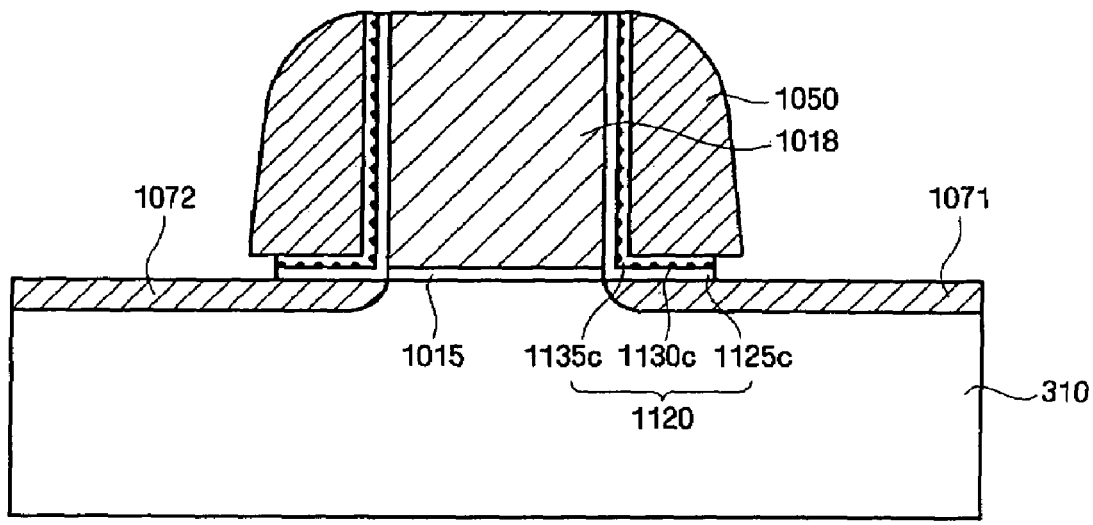

With reference to FIG. 12E, a selective etching process is performed on the resulting structure, for example, according to the process described above in connection with FIG. 7C, that results in the selective etching of an exposed outer portion of the charge trapping structure 1120. Following etch of the charge trapping structure 1120, recesses are formed at the edges of the charge trapping structure 1120.

Figure 12F:
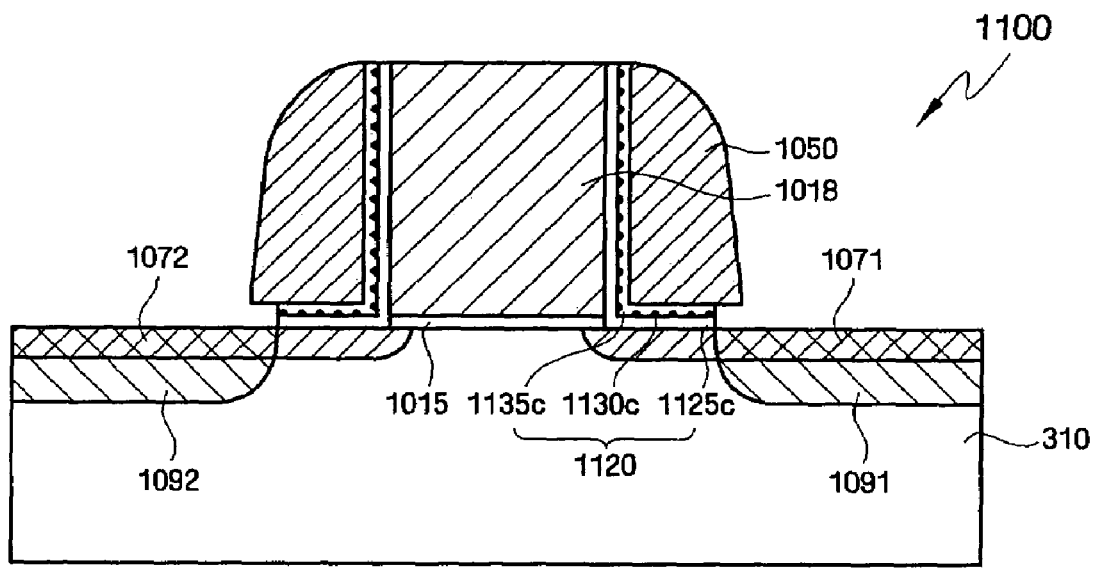

With reference to FIG. 12F, ion implantation is performed on the resulting structure, to form highly doped source/drain regions 1091, 1092 of the device. The resulting highly doped source/drain regions 1091, 1092 are self-aligned with the side gate electrodes 1050. The self-aligned highly doped source/drain regions 1091, 1092 can be formed following the selective etching of the charge trapping structure 1120, or optionally, can be formed prior to the selective etching of the charge trapping structure 1120. A diffusion process is performed on the resulting structure, for example using RTP at a temperature of approximately 1000 C. or greater for a time period of a few seconds, in order to diffuse the lightly doped source/drain regions 1071, 1072 and/or highly doped source/drain structures 1091, 1092 further inward, into the channel region, so that the side gate electrodes 1050 overlap the highly doped source/drain regions 1091, 1092. As a result of the eighth process for fabricating a non-volatile memory device, the resulting device 1100 has a recessed charge trapping layer, which offers the advantages described above.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A non-volatile memory device comprising:
   a semiconductor substrate;
   a source region and a drain region in an upper portion of the substrate at spaced-apart positions;
   a charge-trapping structure on the substrate between the source region and the drain region, the charge-trapping structure comprising a charge-trapping layer; and
   a gate electrode on the charge trapping structure, wherein a recess is present in the charge-trapping layer of the charge-trapping structure between the gate electrode and a portion of at least one of the source region and the drain region, wherein the recessed charge-trapping layer continuously extends between a lightly doped source region of the source region and a lightly doped drain region of the drain region.

2. The non-volatile memory device of claim 1 wherein the gate electrode overlaps a portion of the source region and a portion of the drain region.

3. The non-volatile memory device of claim 1 wherein the source region and drain region each include a highly doped region and a lightly doped region, the lightly doped regions of the source region and the drain region extending toward each other from the corresponding highly doped regions along an upper portion of the substrate, and wherein the gate electrode overlaps a portion of the lightly doped regions of the source region and the drain region.

4. The non-volatile memory device of claim 3 wherein the lightly doped source and drain regions, when originally formed, are self-aligned with the source side and the drain side of the gate electrode.

5. The non-volatile memory device of claim 4 wherein the lightly doped source and drain regions are extended under the source side and the drain side respectively of the gate electrode by a diffusion process.

6. The non-volatile memory device of claim 3 further comprising sidewall spacers at source and drain sides of the gate electrode wherein the highly doped source and drain regions, when originally formed, are self-aligned with outer sides of the sidewall spacers.

7. The non-volatile memory device of claim 1 wherein the source and drain regions, when originally formed, are self-aligned with a source side and a drain side respectively of the gate electrode.

8. The non-volatile memory device of claim 7 wherein the source and drain regions are extended under the source side and the drain side respectively of the gate electrode by a diffusion process.

9. The non-volatile memory device of claim 8 wherein an inner edge of at least one of the source and drain regions is substantially aligned with an outer edge of the charge trapping structure.

10. The non-volatile memory device of claim 1 wherein the recess is at a source region side of the charge trapping layer of the charge-trapping structure.

11. The non-volatile memory device of claim 1 wherein the recess is at both a source region side and a drain region side of the charge trapping layer of the charge-trapping structure.

12. The non-volatile memory device of claim 1 further comprising a dielectric material in the recess.

13. The non-volatile memory device of claim 1 wherein the charge trapping structure comprises a first dielectric, the charge-trapping layer comprising a second dielectric on the first dielectric, and a third dielectric on the second dielectric.

14. The non-volatile memory device of claim 13 wherein the first dielectric comprises a material selected from the group consisting of silicon oxide and silicon oxynitride; wherein the second dielectric comprises a material selected from the group consisting of silicon nitride, silicon oxynitride, and a high-k dielectric, and wherein the third dielectric comprises silicon oxide.

15. The non-volatile memory device of claim 13 wherein the recess is formed in the second dielectric.

16. The non-volatile memory device of claim 1 wherein the charge trapping structure comprises a quantum dot structure including a first dielectric, a quantum dot array on the first dielectric and a second dielectric on the quantum dot array.

17. The non-volatile memory device of claim 16 wherein the first dielectric comprises a material selected from the group consisting of silicon oxide and silicon oxynitride; wherein the quantum dot array comprises quantum dots of a type selected from the group consisting of polysilicon quantum dots, and silicon nitride quantum dots, and wherein the second dielectric comprises silicon oxide.

18. The non-volatile memory device of claim 1 wherein the charge trapping structure extends from the source region to an intermediate region between the source region and the drain region, and further comprising a gate dielectric on the substrate extending from the charge trapping structure in the intermediate region to the drain region, and wherein the gate electrode is on the charge trapping structure and on the gate dielectric.

19. The non-volatile memory device of claim 1 wherein the charge-trapping structure comprises a first charge-trapping structure having a first charge-trapping layer and wherein the gate electrode comprises a first auxiliary side-gate electrode, and further comprising:
 a primary gate dielectric on the substrate between the source region and the drain region;
 a primary gate electrode on the primary gate dielectric;
 the first charge-trapping structure being on the substrate between the source region and the primary gate electrode;
 the first auxiliary side-gate electrode being on the first charge-trapping structure at a first sidewall of the primary gate electrode, wherein the first charge trapping structure is further present between the first auxiliary side-gate electrode and the first sidewall of the primary gate electrode, and wherein a first recess is present in the first charge-trapping layer of the first charge-trapping structure between the first auxiliary side-gate electrode and a portion of the source region;
 a second charge-trapping structure having a second charge-trapping layer on the substrate between the drain region and the primary gate electrode; and
 a second auxiliary side-gate electrode on the second charge-trapping structure at a second sidewall of the primary gate electrode, wherein the second charge-trapping structure is further present between the second auxiliary side-gate electrode and the second sidewall of the primary gate electrode, and wherein a second recess is present in the second charge-trapping layer of the second charge-trapping structure between the second auxiliary side-gate electrode and a portion of the drain region.

20. A non-volatile memory device comprising:
a semiconductor substrate;
a source region and a drain region in an upper portion of the substrate at spaced-apart positions;
a primary gate dielectric on the substrate between the source region and the drain region;
a primary gate electrode on the primary gate dielectric;
a first charge-trapping structure comprising a first charge-trapping layer on the substrate between the source region and the primary gate electrode;
a first auxiliary side-gate electrode on the first charge-trapping structure at a first sidewall of the primary gate electrode, wherein the first charge-trapping structure is further present between the first auxiliary side-gate electrode and the first sidewall of the primary gate electrode, and wherein a first recess is present in the first charge-trapping layer of the first charge-trapping structure between the first auxiliary side-gate electrode and a portion of the source region;
a second charge-trapping structure comprising a second charge-trapping layer on the substrate between the drain region and the primary gate electrode; and
a second auxiliary side-gate electrode on the second charge-trapping structure at a second sidewall of the primary gate electrode, wherein the second charge-trapping structure is further present between the second auxiliary side-gate electrode and the second sidewall of the primary gate electrode, and wherein a second recess is present in the second charge-trapping layer of the second charge-trapping structure between the second auxiliary side-gate electrode and a portion of the drain region.

21. The non-volatile memory device of claim 20 wherein the first and second auxiliary side-gate electrodes comprise conductive lateral spacers formed on the first charge trapping structure and the second charge trapping structure at a drain side and a source side respectively of the primary gate electrode.

22. The non-volatile memory device of claim 20 wherein the first and second charge trapping structures each comprise a first dielectric, a second dielectric on the first dielectric, and a third dielectric on the second dielectric.

23. The non-volatile memory device of claim 22 wherein the first dielectric comprises a material selected from the group consisting of silicon oxide and silicon oxynitride; wherein the second dielectric comprises a material selected from the group consisting of silicon nitride, silicon oxynitride, and a high-k dielectric, and wherein the third dielectric comprises silicon oxide.

24. The non-volatile memory device of claim 22 wherein the first and second recesses are formed in the second dielectric of the first and second charge trapping structures, respectively.

25. The non-volatile memory device of claim 20 wherein the first and second charge trapping structures each comprise a quantum dot structure including a first dielectric, a quantum dot array on the first dielectric and a second dielectric on the quantum dot array.

26. The non-volatile memory device of claim 25 wherein the first dielectric comprises a material selected from the group consisting of silicon oxide and silicon oxynitride; wherein the quantum dot array comprises quantum dots of a type selected from the group consisting of polysilicon quantum dots, and silicon nitride quantum dots, and wherein the second dielectric comprises silicon oxide.

27. The non-volatile memory device of claim 20 further comprising a dielectric material in the first and second recesses.

28. A non-volatile memory device comprising:
a semiconductor substrate;
a source region and a drain region in an upper portion of the substrate at spaced-apart positions;
a charge-trapping structure on the substrate between the source region and the drain region, the charge-trapping structure comprising a charge-trapping layer; and
a gate electrode on the charge trapping structure, wherein a recess is present in the charge-trapping layer of the charge-trapping structure between the gate electrode and a portion of at least one of the source region and the drain region, wherein the charge-trapping structure comprises a first charge-trapping structure having a first charge-trapping layer and wherein the gate electrode comprises a first auxiliary side-gate electrode, and further comprising:
a primary gate dielectric on the substrate between the source region and the drain region;
a primary gate electrode on the primary gate dielectric;
the first charge-trapping structure being on the substrate between the source region and the primary gate electrode;
the first auxiliary side-gate electrode being on the first charge-trapping structure at a first sidewall of the primary gate electrode, wherein the first charge trapping structure is further present between the first auxiliary side-gate electrode and the first sidewall of the primary gate electrode, and wherein a first recess is present in the first charge-trapping layer of the first charge-trapping structure between the first auxiliary side-gate electrode and a portion of the source region;
a second charge-trapping structure having a second charge-trapping layer on the substrate between the drain region and the primary gate electrode; and
a second auxiliary side-gate electrode on the second charge-trapping structure at a second sidewall of the primary gate electrode, wherein the second charge-trapping structure is further present between the second auxiliary side-gate electrode and the second sidewall of the primary gate electrode, and wherein a second recess is present in the second charge-trapping layer of the second charge-trapping structure between the second auxiliary side-gate electrode and a portion of the drain region.

* * * * *

UNITED STATES PATENT AND TRADEMARK OFFICE
CERTIFICATE OF CORRECTION

PATENT NO.        : 7,446,371 B2                                        Page 1 of 1
APPLICATION NO.   : 11/167051
DATED             : November 4, 2008
INVENTOR(S)       : Sang-su Kim It is certified that error appears in the above-identified patent and that said Letters Patent is hereby corrected as shown below:

Column 19, line 33 claim 10 delete "charge trapping" and insert --charge-trapping--

Column 19, line 37 claim 11 delete "charge trapping" and insert --charge-trapping--

Column 19, line 41 claim 13 delete "charge trapping" and insert --charge-trapping--

Signed and Sealed this

Tenth Day of March, 2009

JOHN DOLL
*Acting Director of the United States Patent and Trademark Office*